United States Patent
Lee

(10) Patent No.: US 8,462,009 B2
(45) Date of Patent: Jun. 11, 2013

(54) SYSTEM AND METHOD FOR INTRODUCING A SUBSTRATE INTO A PROCESS CHAMBER

(75) Inventor: In Taek Lee, Incheon (KR)

(73) Assignee: ADP Engineering Co., Ltd., Seongnam-si (KR)

(*) Notice: Subject to any disclaimer, the term of this patent is extended or adjusted under 35 U.S.C. 154(b) by 699 days.

(21) Appl. No.: 12/712,558

(22) Filed: Feb. 25, 2010

(65) Prior Publication Data

US 2010/0148979 A1   Jun. 17, 2010

Related U.S. Application Data

(62) Division of application No. 11/874,349, filed on Oct. 18, 2007, now Pat. No. 7,750,818.

(30) Foreign Application Priority Data

Nov. 29, 2006 (KR) .................. 10-2006-0118921
Nov. 29, 2006 (KR) .................. 10-2006-0118922
Nov. 29, 2006 (KR) .................. 10-2006-0118924

(51) Int. Cl.
 *G08B 21/00*  (2006.01)

(52) U.S. Cl.
 USPC ............ 340/686.1; 340/686.6; 340/691.5; 340/691.6; 340/691.8; 414/217.1; 414/935; 414/936; 414/939; 700/213; 700/214; 700/218

(58) Field of Classification Search
 USPC ........ 340/686.1, 686.6, 691.5, 691.6, 691.8; 414/217.1, 935, 936, 939; 700/213, 214, 700/218
 See application file for complete search history.

(56) References Cited

U.S. PATENT DOCUMENTS

| 4,213,056 | A  | * | 7/1980  | Matsumura et al. ..... 250/559.01 |
| 5,474,410 | A  |   | 12/1995 | Ozawa et al. |
| 5,555,181 | A  | * | 9/1996  | Seto ................................ 355/41 |
| 5,584,971 | A  | * | 12/1996 | Komino ................... 204/192.13 |
| 6,402,400 | B1 |   | 6/2002  | Ueda et al. |
| 6,861,614 | B1 |   | 3/2005  | Tanabe et al. |
| 7,139,638 | B2 |   | 11/2006 | Nakajima et al. |
| 7,217,942 | B2 | * | 5/2007  | Tanaka .......................... 250/554 |
| 7,370,687 | B2 | * | 5/2008  | Mizota et al. ................. 164/457 |

FOREIGN PATENT DOCUMENTS

| TW | 495806 | 7/2002 |
| TW | I255505 | 5/2006 |

OTHER PUBLICATIONS

Taiwanese Office Action issued in TW Application No. 096141121 dated Mar. 15, 2011.
Notice of Allowance issued in U.S. Appl. No. 12/712,533, dated Feb. 25, 2013.

* cited by examiner

*Primary Examiner* — Tai T Nguyen
(74) *Attorney, Agent, or Firm* — KED & Associates, LLP

(57) ABSTRACT

A system and method for introducing a substrate into a process chamber is provided. A presence or absence of a substrate on a stage in an apparatus for manufacturing a semiconductor or a flat panel display may be determined by lift pins used for loading and unloading a substrate, the introduction of another substrate may be prevented and a broken state or the erroneously loaded state of the substrate may be detected. An opening or closing of a gate valve may also be determined, and the introduction of a substrate into the process chamber may be prevented while the gate valve is closed.

6 Claims, 25 Drawing Sheets

SYSTEM AND METHOD FOR INTRODUCING A SUBSTRATE INTO A PROCESS CHAMBER

This application is a Divisional Application of prior U.S. patent application Ser. No. 11/874,349 filed Oct. 18, 2007, now U.S. Pat. No. 7,750,818 which claims priority under 35 U.S.C. §119 to Korean Patent Application Nos. 10-2006-0118921 filed on Nov. 29, 2006; 10-2006-0118922 filed Nov. 29, 2006; and 10-2006-0118924 filed Nov. 29, 2006, whose entire disclosures are hereby incorporated by reference.

BACKGROUND

1. Field

This relates to substrate processing systems, and more particularly, to monitoring systems used in substrate processing systems to facilitate the transfer of substrates.

2. Background

Flat panel displays may include liquid crystal displays, plasma display panels, organic light emitting diodes, and other such devices. These flat panel displays may be manufactured using a vacuum processing apparatus that includes a process chamber, a load lock chamber and a transfer chamber.

The process chamber processes the surface of a substrate by, for example, conducting an etching process using plasma, thermal energy, and the like in a vacuum. The load lock chamber receives an unprocessed substrate from the outside, and discharges a processed substrate to the outside while alternating between an atmospheric condition and a vacuum condition. The transfer chamber may serve as an intermediate holding place when introducing and discharging substrates into and out of the process chamber. To this end, the transfer chamber may be positioned between the process chamber and the load lock chamber. Proper sequencing and transfer of substrates into and out of the process chamber is important in ensuring proper processing of the substrates and preventing damage to the substrates during transfer.

BRIEF DESCRIPTION OF THE DRAWINGS

The embodiments will be described in detail with reference to the following drawings in which like reference numerals refer to like elements wherein:

FIGS. 1A and 1B are cross-sectional views of an exemplary process chamber, wherein FIG. 1A illustrates a raised state of lift pins and FIG. 1B illustrates a lowered state of the lift pins;

FIGS. 2A and 2B are plan views of substrates positioned in the exemplary process chamber shown in FIGS. 1A and 1B, wherein FIG. 2A illustrates a broken state of a substrate and FIG. 2B illustrates an erroneously loaded state of a substrate;

FIGS. 10A and 10B are enlarged views of part 'B' of FIG. 9, wherein FIG. 10A illustrates a state in which displacement does not occur in a lift pin and FIG. 10B illustrates a state in which displacement does occur in the lift pin;

DETAILED DESCRIPTION

Figure 1A:
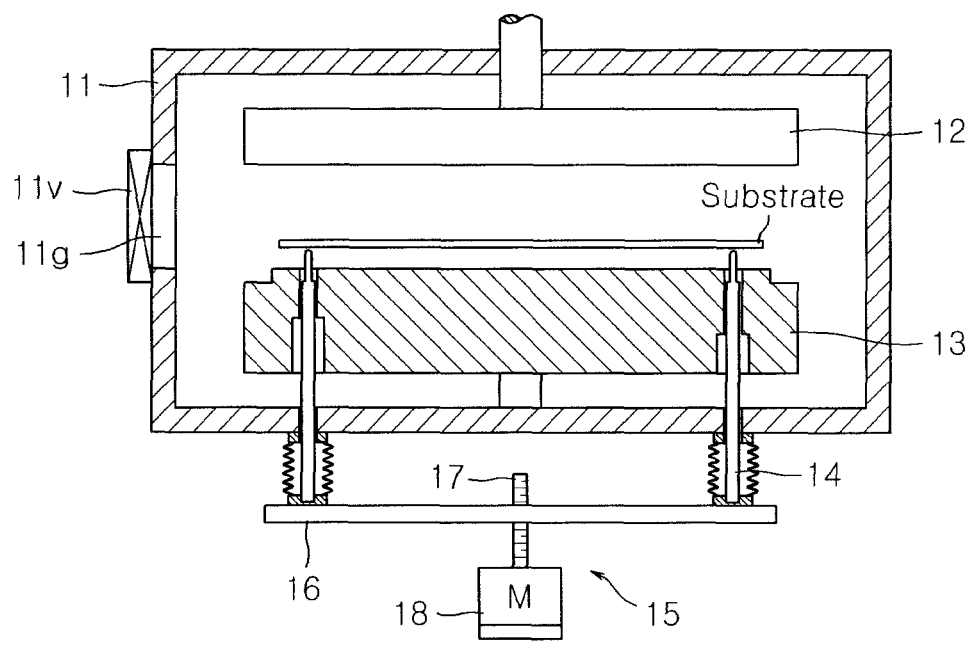

Reference will be made to various embodiments, examples of which are illustrated in the accompanying drawings. Wherever possible, the same reference numerals will be used throughout the drawings and the description to refer to the same or like parts.

Figure 1B:
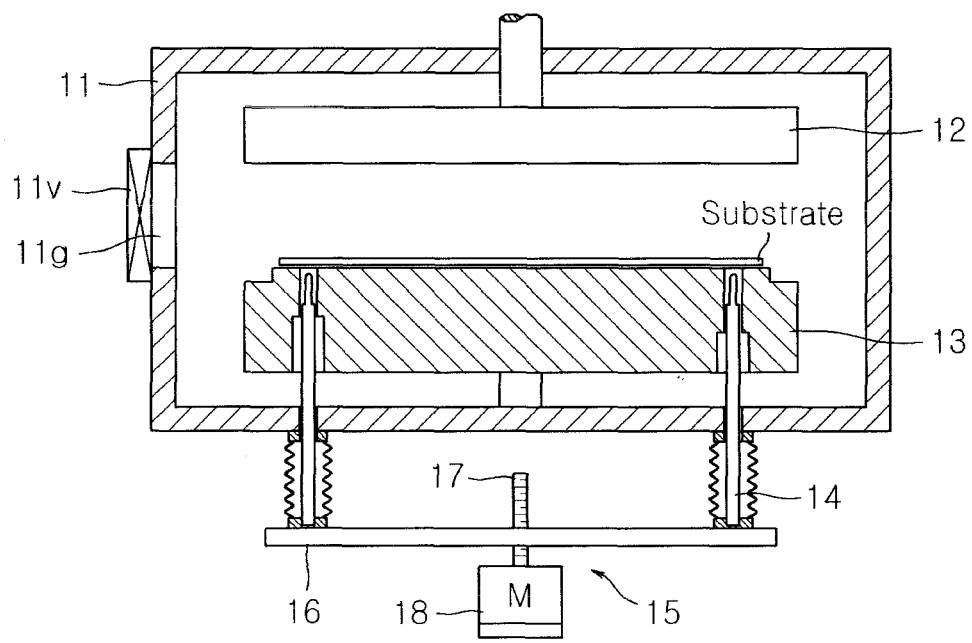

FIGS. 1A and 1B are cross-sectional views of an exemplary process chamber. The process chamber may include a chamber 11 having a gate slit 11g in a sidewall thereof so that a substrate can be introduced into or discharged from the chamber 11, an upper electrode assembly 12 installed in an upper region of the chamber 11, a lower electrode assembly 13 positioned below the upper electrode assembly 12, a plurality of lift pins 14 installed in the lower electrode assembly 13, and a lifting mechanism 15 which simultaneously raises and lowers the plurality of lift pins 14. A gate slit and gate valve may also be provided with the transfer chamber and/or the load lock chamber as appropriate.

The gate slit 11g may be opened and closed by a gate valve 11v. A substrate to be processed may be positioned on an upper surface of the lower electrode assembly 13, or "stage". The lifting mechanism 15 may include a pin plate 16 to which the lower ends of the respective lift pins 14 are fixed, and a ball screw 17 and a motor 18 which raise and lower the pin plate 16 in a ball screw driving manner.

To introduce a substrate into the process chamber a transfer robot (not shown), which is in a standby state in the load lock chamber (not shown), may be actuated. The substrate may be held above the lower electrode assembly 13 (hereinafter, referred to as a "stage"), as shown in FIG. 1A, and the lift pins 14 may be raised by the lifting mechanism 15. Then, when the lift pins 14 are sufficiently raised, the transfer robot may place the substrate on the raised lift pins 14 and move out of the chamber 11, and the lift pins 14 may be lowered. As shown in FIG. 1B, once fully lowered, the lift pins 14 are completely inserted into the stage 13 and do not project above the upper surface of the stage 13, and the substrate is supported by the stage 13.

When the surface treatment of the substrate is completed, the lift pins 14 may be raised to raise the substrate from the stage 13, and the arm of the transfer robot may move into position below the substrate. Thereafter, as the lift pins 14 are lowered, the substrate may rest on the arm of the transfer robot as the transfer robot moves out of the chamber 11 to discharge the substrate from the chamber 11. In the process chamber as described above, continuous introduction of substrates is likely to continue unless the process is manually interrupted. Thus, if a substrate is introduced into the chamber 11 for processing and another substrate is already positioned the chamber 11, the arm of the transfer robot and the previously introduced substrate may interfere with each other, possibly damaging one or both of the substrates.

To alleviate this problem, the chamber 11 may include an inspection window (not shown) to allow the inside of the chamber 11 to be viewed from the outside. However, the inside of the chamber 11 may be poorly lit, or unlit, and thus it may be difficult to positively confirm the presence of a substrate in the chamber 11. Further, performing a visual inspection of the inside of the chamber 11 every time a new substrate is to be introduced into the chamber 11 to check for the presence of a substrate is time consuming and may slow down the manufacturing process.

Figure 2A:
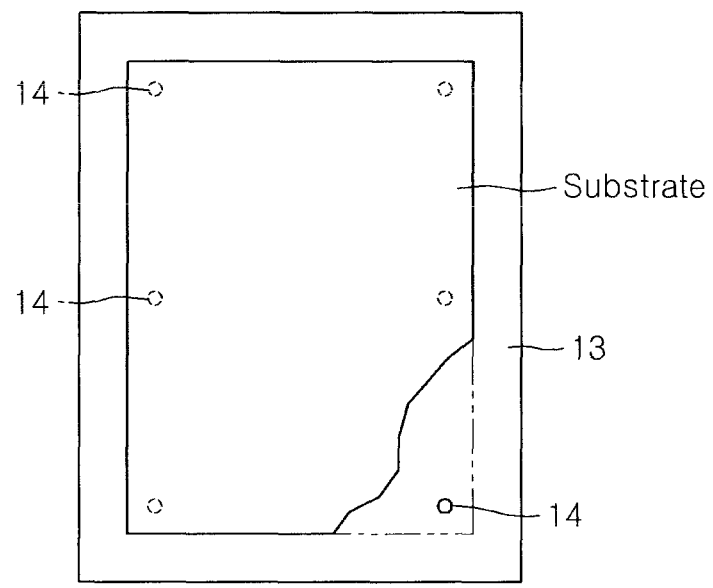
Figure 2B:
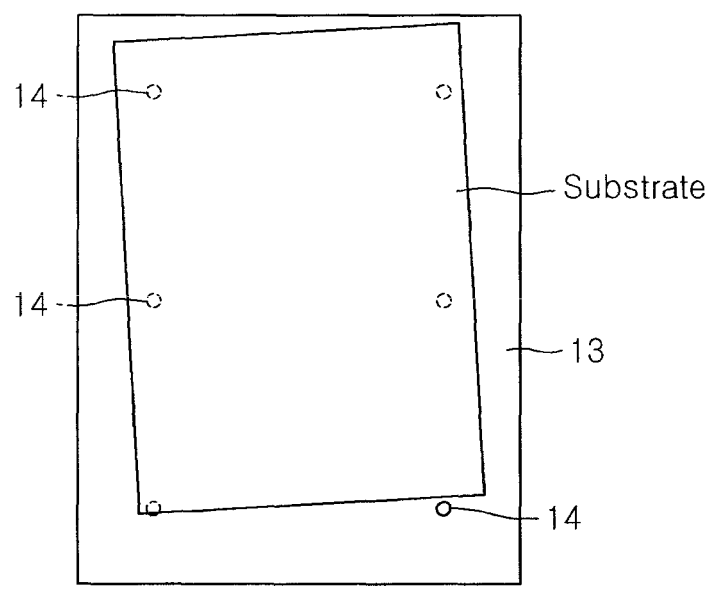

If no visual inspection is conducted, or the inspection is inaccurate, a substrate may be introduced into the chamber 11 in a broken state, as shown in FIG. 2A, or the introduced substrate may be erroneously loaded, as shown in FIG. 2B, depending upon the state of the transfer robot. If a broken or misaligned substrate is introduced into the chamber 11, processing operations may be performed on a substrate which may ultimately be rejected.

Figure 3:
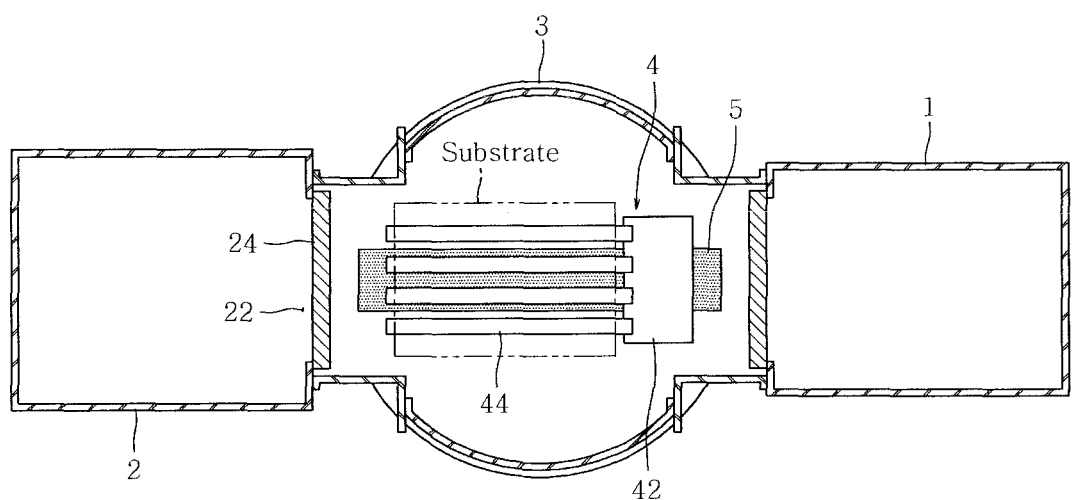
FIG. 3 is a plan view of an exemplary apparatus for manufacturing a flat panel display.

FIG. 3 is a plan view of an exemplary apparatus for manufacturing a flat panel display which may include a load lock chamber 1, a process chamber 2 having a gate slit 22 and a gate valve 24, a transfer chamber 3, a transfer robot 4, and a guide 5. The transfer robot 4 may include a robot body 42 which is moved along the guide 5 by a driving force generated by driving means, and hands 44 provided with the robot body 42 to receive substrates to be transferred.

To introduce a substrate into the process chamber 2 for processing, the gate valve 24 may be opened to open the gate slit 22. The transfer robot 4 may be loaded with a substrate in the load lock chamber 1 and moved toward the process chamber 2 along the guide 5, and may enter the process chamber 2 through the gate slit 22. Then, the transfer robot 4 may unload the substrate and return to the transfer chamber 3. During processing, the gate valve 24 and gate slit 22 may remain closed.

As described above, when introducing the substrate into the process chamber 2, the gate valve 24 is necessarily opened to open the gate slit 22. However, if the gate valve 24 remains closed due to, for example, breakdown or misoperation, this condition may not be recognized due to the construction of the apparatus and the inspection capabilities as set forth above. Therefore, a substrate being transferred into the process chamber 2 by the transfer robot 4 may collide against the gate valve 24, possibly damaging the substrate, the transfer robot 4 and/or the gate valve 24.

Figure 4:
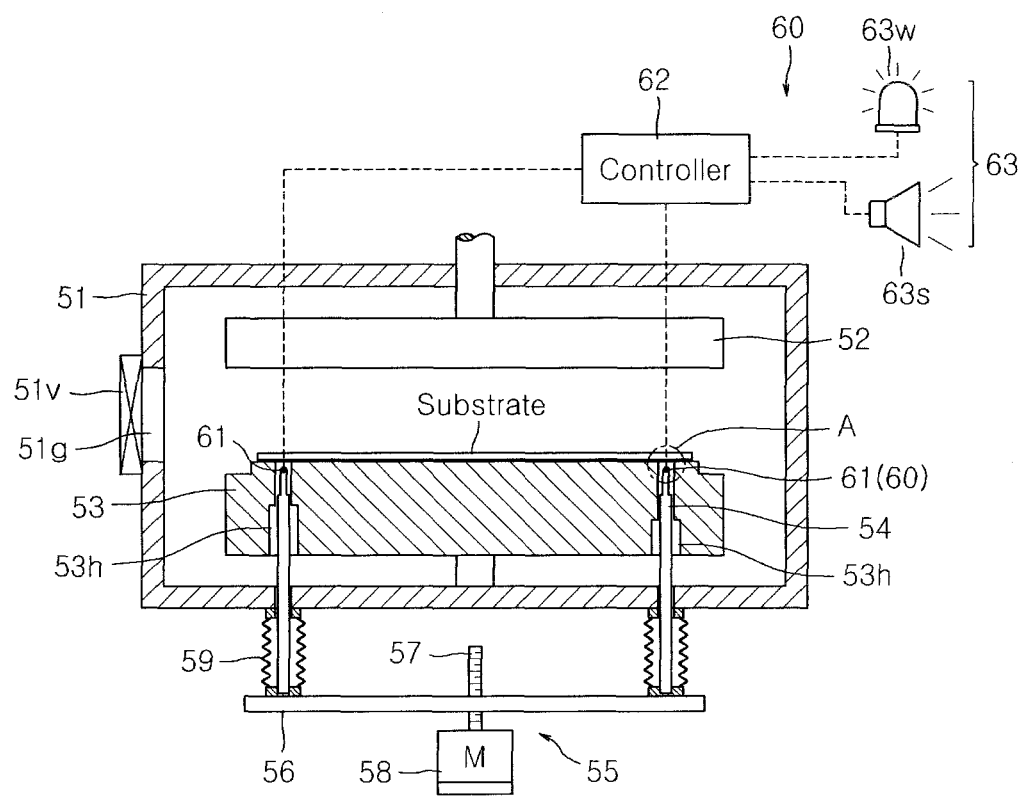
FIG. 4 is a cross-sectional view of a process chamber to which a device for determining the presence or the absence of a substrate using lift pins, in accordance with a first embodiment as broadly described herein, may be applied.
Figure 5:
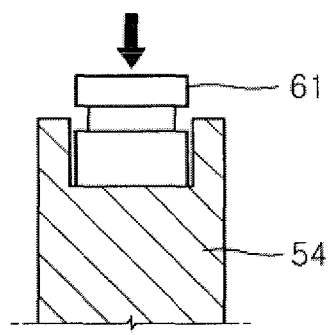
FIG. 5 is an enlarged view of part 'A' of FIG. 4.

To address these issues, a process chamber, as shown in FIGS. 4 and 5, may include a chamber 51 which may provide a vacuum space for the surface treatment of a substrate, an upper electrode assembly 52 and a lower electrode assembly 53 which may be respectively installed facing each other in an upper region and a lower region inside the chamber 51, a plurality of lift pins 54 which may be vertically raised and lowered through the lower electrode assembly 53, a pin lifting mechanism 55 which may simultaneously raise and simultaneously lower the plurality of lift pins 54, and a device 60 which uses the lift pins 54 and associated pin lifting mechanism 55 to determine whether a substrate is already present in the chamber 51. The chamber 51 may have a gate slit 51g in one sidewall thereof through which a substrate may be introduced into or discharged from the chamber 51. The gate slit 51g may be opened and closed by a gate valve 51v. A bellows 59 may enclose the lift pins 54 between the chamber 51 and a portion of the pin lifting mechanism 55 to maintain a vacuum state in the chamber 51.

The upper electrode assembly 52 may include a shower head (not shown) for injecting a processing gas for surface treatment of the substrate. The lower electrode assembly 53 may serve as a chuck top on which the introduced substrate may be placed, and thus a receiving surface of the lower electrode assembly 53 may be referred to as a "stage". The lower electrode assembly 53 may include pin holes 53h through which the respective lift pins 54 may be raised and lowered. The pin holes 53h may extend in the vertical direction, or in a direction that corresponds to an orientation of the lift pins 54. The pin holes 53h may be provided at regular intervals adjacent to the edges of the lower electrode assembly 53 (hereinafter, referred to as the "stage"). The number and the positions of the pin holes 53h may be changed depending upon the number and the locations of the lift pins 54 and the positioning, support and movement required by the substrate.

The pin lifting mechanism 55 may include a pin plate 56 to which the lower ends of the respective lift pins 54 may be fixed, and driving means for raising and lowering the pin plate 56. The driving means shown in FIG. 4 includes a ball screw 57 coupled to the pin plate 56, and a motor 58 for rotating the ball screw 57 in two directions (clockwise and counter-clockwise). Other components for the driving means may also be appropriate.

The device 60 for determining the presence or the absence of a substrate may include substrate sensing means 61, determination means 62 and notification means 63. The substrate sensing means 61 may sense whether the load of a substrate acts on the lift pins 54 when the lift pins 54 are raised to project from the stage 53 and support the substrate. The substrate sensing means 61 may be configured in a manner such that, when it is sensed that the load of the substrate acts on the lift pins 54, corresponding sensing results, or sensing signals, are output from the substrate sensing means 61 to the determination means 62. To facilitate the substantially immediate output of such a signal, the determination means 62 may be electrically connected to the substrate sensing means 61.

The substrate sensing means 61 may include sensors installed on the respective upper ends of some or all of the lift pins 54 to be brought into contact with the substrate, and to be actuated by the load of the substrate when the load of the substrate acts on the lift pins 54. When the sensors receive the load of the substrate, the sensors may be actuated by the load of the substrate and output corresponding sensing signals to the determination means 62. For example, a push switch may be configured such that an electrical connection is mechanically generated when the push switch is pushed. Alternatively, an electric contact sensor or an electric strain gauge that electrically senses contact with the substrate may be employed.

The determination means 62 may receive sensing signals from the substrate sensing means 61, that is, the sensors, and thereby determine the presence or the absence of a substrate. The determination means 62 may include control means for controlling the operation of an apparatus for manufacturing a flat panel display. When it is determined as described above that a substrate is present in the chamber 51, the control means may output a corresponding control signal such that the notification means 63, which may be electrically connected to the control means, may be actuated. Conversely, if it is determined that no substrate is present in the chamber 51, the control means may output a corresponding control signal such that a substrate to be processed may be introduced into the chamber 51. In this way, the control means may control operation of the apparatus for manufacturing a flat panel display.

The notification means 63 may notify a worker of the presence of a substrate under control of the control means. The notification means 63 may include, for example, a warning lamp 63w or monitor for visual notification, a speaker 63s or buzzer, for auditory notification, or other means as appropriate. Likewise, visual notification means and auditory notification means may be used together.

Warning lamps 63w may be provided in a number that corresponds to the number of sensors 61 (the number of lift pins 54 if each lift pin 54 has a sensor 61) so that, when each sensor 61 outputs a sensing signal, the control means may turn on the corresponding warning lamp 63w in response to the sensing signal. In this scenario, due to the fact that the sensors 61 are installed on each of the respective lift pins 54, if the load of the substrate in the chamber 51 is not evenly distributed and thus does not act on all the lift pins 54, it may be determined that the substrate is partially broken or has been erroneously loaded if the load of the substrate does not act on all of the lift pins 54. As a consequence, it may be possible to determine whether the introduced substrate is in an appropriate state.

Figure 6:
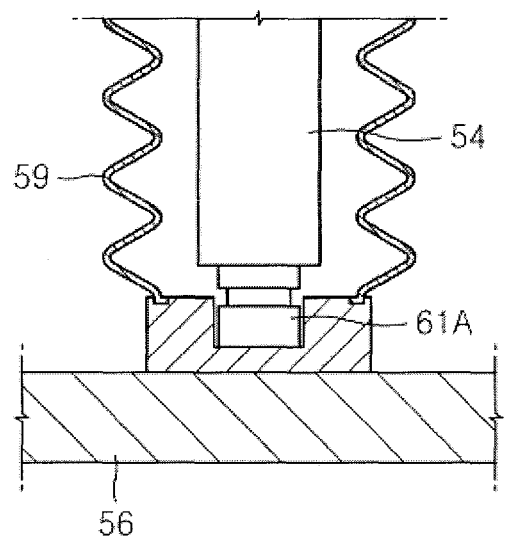
FIG. 6 is a partial cross-sectional view of a device for determining the presence or the absence of a substrate using lift pins, in accordance with a second embodiment as broadly described herein.

As shown in FIG. 6, a device for determining the presence or the absence of a substrate using lift pins in accordance with a second embodiment may include substrate sensing means 61A respectively mounted to the lower ends of the lift pins 54 so as to be positioned between the lift pins 54 and a support structure thereof, such as, for example, the pin plate 56. Alternatively, the support structure may include other component elements as long as they are positioned along the lines of action along which the load of the substrate acts on the lift pins 54, to support the lift pins 54.

Figure 7:
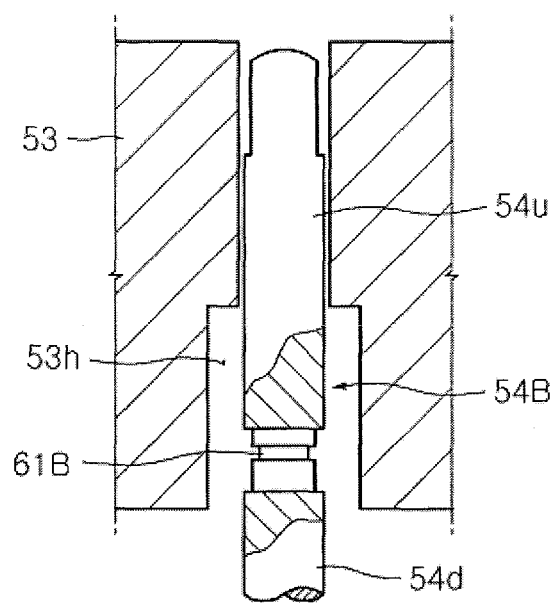
FIG. 7 is a partial cross-sectional view of a device for determining the presence or the absence of a substrate using lift pins, in accordance with a third embodiment as broadly described herein.

As shown in FIG. 7, in a device for determining the presence or the absence of a substrate using lift pins according to a third embodiment, each lift pin 54B may include an upper pin 54u positioned at an upper position, and a lower pin 54d positioned below the upper pin 54u. Therefore, when viewed in its entirety, each lift pin 54B may have a structure which is divided into upper and lower parts. Substrate sensing means 61B may be positioned between the upper pin 54u and the lower pin 54d of the lift pin 54B divided in this manner. The substrate sensing means 61B may be mounted to the upper end of the lower pin 54d, or to the lower end of the upper pin 54u.

A method for introducing a substrate and inspecting a state of the introduced substrate using any one of the devices for determining the presence or the absence of a substrate according to the first through third embodiments will now be described with reference to FIG. 8.

During normal operation, the lift pins 54 may be lowered and inserted into the pin holes 53h such that the upper ends thereof do not project from the stage 53. To introduce into the chamber 51 a substrate which is in a standby state in a load lock chamber, and load the substrate onto the stage 53 for processing, the plurality of lift pins 54 may be simultaneously raised to receive the substrate and then lowered to original positions thereof by the driving force from the pin lifting mechanism 55 (S1).

The sensors of the substrate sensing means 61 sense whether a substrate is placed on the lift pins 54 by sensing whether the load of the substrate acts on the lift pins 54 and transmits the sensing results to the control means (S2). The control means determines that a substrate is present if a sensing signal from at least one sensor is inputted thereto (S3). Conversely, if no sensing signal is inputted from the sensors, the control means determines that no substrate is present (S4).

When the presence of a substrate is determined (S3), the control means outputs a control signal and actuates the notification means 63 (S13). A worker may recognize the presence of the substrate based on the notification, and may take subsequent necessary actions. In this case, the control means may be further configured to prevent the introduction of a new substrate if an existing substrate is sensed in the chamber 51. Alternatively, or alternately, the process may proceed to determining whether or not a load acts on all of the lift pins 54 (S&) to determine a state of the detected substrate.

When the absence of a substrate is determined (S4), the transfer robot may be driven to introduce a substrate to be processed, and position the substrate above the stage 53 (S5). The lift pins 54 may be raised to receive the newly introduced substrate from the transfer robot, and then lowered to the original positions (S6). After the lift pins 54 receive the substrate, the transfer robot may move out of the chamber 51.

The sensors sense whether the load of the substrate acts on all of the lift pins 54, and the control means receives the sensing results from the sensors (S7). If a sensing signal is not received from each of the sensors, the control means determines that a corresponding portion of the substrate is broken (see FIG. 2A) or that the substrate has been erroneously loaded (see FIG. 2B) (S8). Conversely, if sensing signals are inputted from all the sensors, the control means determines that the substrate is not broken and that the substrate has been correctly loaded (S9).

If it is determined that the substrate is in an inappropriate state (S8), the control means outputs a signal to actuate the notification means 63 (S13) in order to notify the worker of this situation. Therefore, the worker can recognize the state of the substrate and can take appropriate action. The control means may be further configured to interrupt the implementation of a following process until the worker has taken corrective action.

Conversely, if it is determined that the substrate is in an appropriate state (S9), the surface treatment of the substrate is implemented (S10). If the surface treatment is completed, the substrate, having completely undergone the surface treatment, is discharged through raising of the lift pins 54, introduction of the transfer robot into the chamber 51, lowering of the lift pins 54, and movement of the transfer robot out of the chamber 51 (S11). The apparatus may then either process another substrate, or complete processing (S12).

Figure 9:
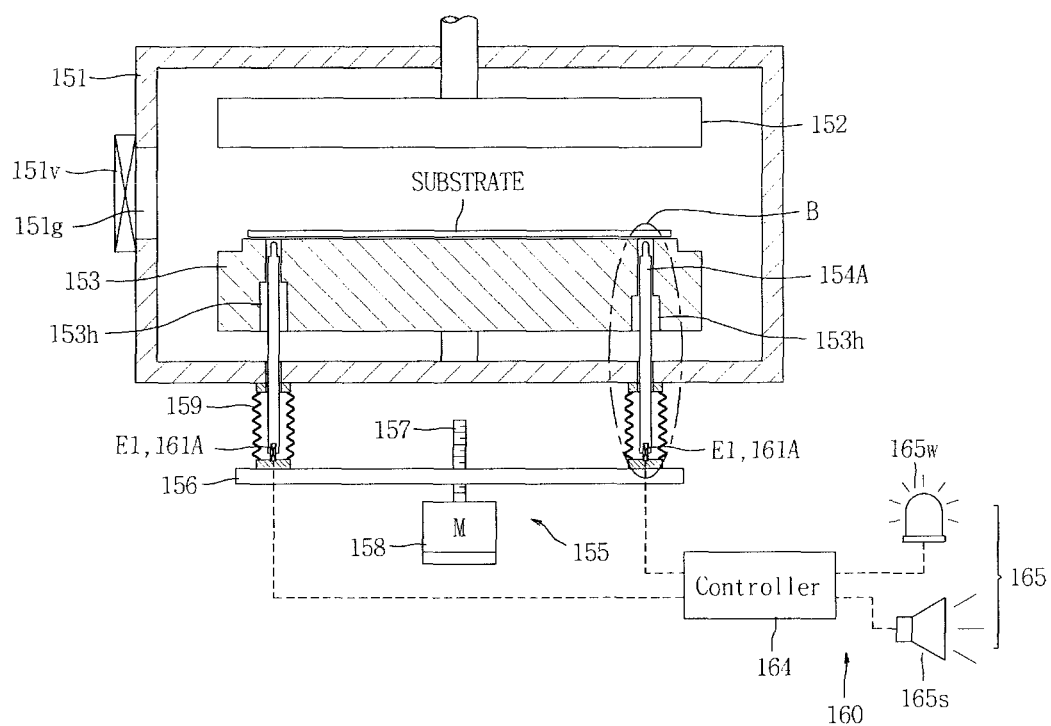
FIG. 9 is a cross-sectional view of a process chamber to which a device for determining the presence or the absence of a substrate using lift pins, in accordance with a fourth embodiment as broadly described herein, may be applied.
Figure 10A:
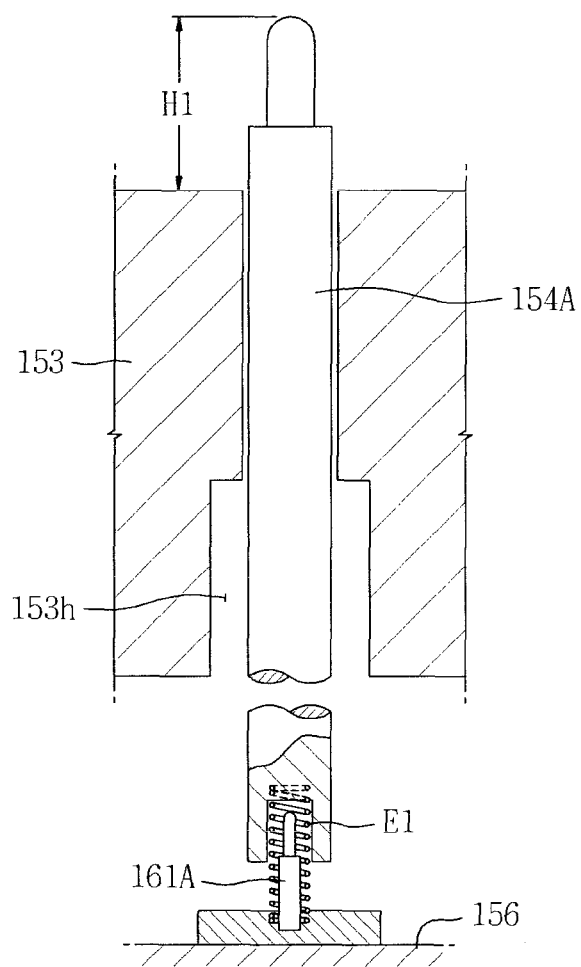
Figure 10B:
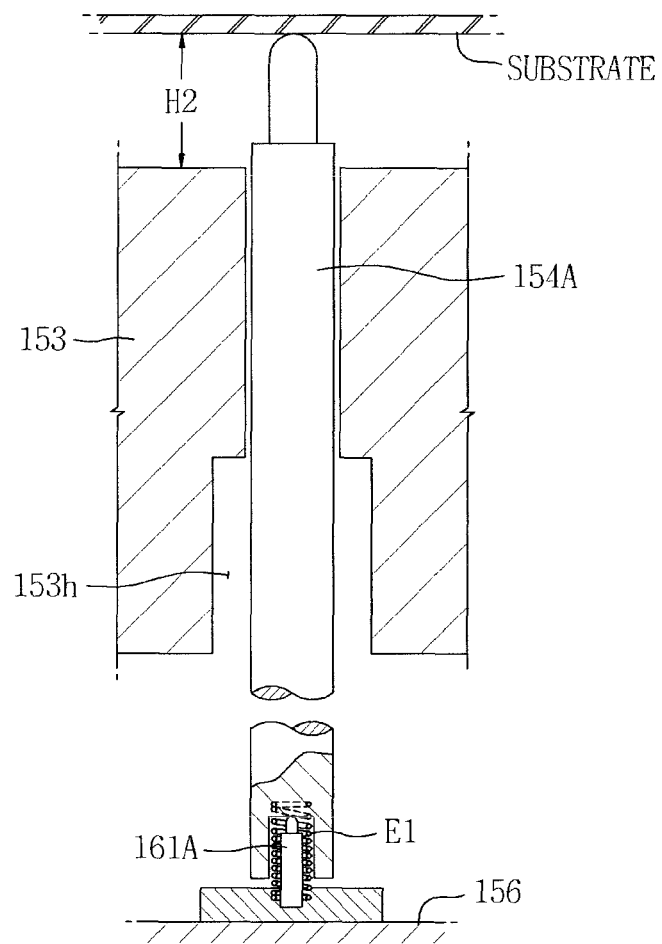

A process chamber and a device for determining the presence or the absence of a substrate using lift pins in accordance with a fourth embodiment as shown in FIGS. 9 and 10A-10B may include a chamber 151, a gate slit 151g, a gate valve 151v, an upper electrode assembly 152, a stage 153, pin holes 153h, a plurality of lift pins 154A, a pin lifting mechanism 155, a pin plate 156, a ball screw 157, a motor 158, bellows 159, and a device 160 for determining the presence or the absence of a substrate. Among these component elements, the chamber 151, the gate slit 151g, the gate valve 151v, the upper electrode assembly 152, the stage 153, the pin holes 153h, the pin lifting mechanism 155, the pin plate 156, the ball screw 157, the motor 158, and the bellows 159 are similar to those discussed previously, and therefore, detailed descriptions thereof will be omitted herein.

The plurality of lift pins 154A may have a structure in which, depending upon whether or not a substrate is placed on the stage 153, a projecting height of the lift pins 154A is changed and the lift pins 154A are displaced. Each lift pin 154A may include a body and an elastic member E1 that elastically supports the body. In certain embodiments, each elastic member E1 may be a coil spring installed at the lower end of the body of the lift pin 154A, positioned between the body of the lift pin 154A and the pin plate 156. The coil spring may also provide a support structure for supporting the lift pin 154A.

If the pin lifting mechanism 155 is actuated with a substrate placed on the stage 153 and each lift pin 154A is raised, the elastic member E1 is compressed by the load of the substrate, as shown in FIG. 10B, and the projecting height of the lift pin 154A is decreased in comparison to when the lift pin 154A is raised with no substrate placed on the stage 153, as shown in FIG. 10A. The elastic member E1 may have a strength such that it is compressed by the load of the substrate, but is not compressed by the load of the body of the lift pin 154A when no substrate is placed on the stage 153. The elastic member E1 may be a coil spring, as shown, rubber, sponge, or other suitable component.

The displacement structure of the lift pin 154A is shown in FIGS. 10A and 10B. In FIG. 10A, the lift pin 154A is raised with no substrate placed on the stage 153, and H1 represents the corresponding projecting height of the lift pin 154A. In FIG. 10B, the lift pin 154A is raised with a substrate placed on the stage 153, and H2 represents the corresponding projecting height of the lift pin 154A.

The device 160 for determining the presence or the absence of a substrate, as shown in FIG. 9, may include displacement sensing means 161A, determination means 164 and notification means 165.

Each displacement sensing means 161A senses whether the elastic member E1 is compressed by a substrate to change the projecting height of the lift pin 154A from a completely raised position in which the lift pin 154A projects from the stage 153 by a predetermined height. When it is sensed that the lift pin 154A is displaced, the corresponding sensing result (the corresponding sensing signal) is transmitted from the displacement sensing means 161A to the determination means 164. To provide for substantially immediate transmission of this signal, the determination means 164 may be electrically connected to the displacement sensing means 161A.

The displacement sensing means 161A sense the displacements of all the respective lift pins 154A. The displacement sensing means 161A may be respectively installed along the lines of action, along which force for compressing the elastic members E1 acts, so as to be actuated by the force when the elastic members E1 are compressed and the intervals between the bodies of the lift pins 154A and the pin plate 156 are decreased. The displacement sensing means 161A may include sensors in a manner such that, when the sensors receive the force, the sensors are actuated by the force and output sensing signals to the determination means 164.

In certain embodiments, each sensor may be installed on the pin plate 156 and inserted into the coil spring that forms the elastic member E1 so as to be positioned between the body of the lift pin 154A and the pin plate 156. Other installation arrangements may also be appropriate, and it is sufficient for each sensor to be positioned along the line of action so that each sensor can receive the action force. For example, an actuation arm may be provided at a lower portion of the body of the lift pin 154A to extend perpendicularly to the direction in which the lift pin 154A is raised and lowered, and a sensor may be installed on the pin plate 156 to be positioned between the actuation arm and the pin plate 156.

The sensors described above may be, for example, a push switch configured such that an electrical connection may be mechanically formed when the push switch is pushed (by the body of the lift pin 154A). Alternatively, an electric contact sensor or an electric strain gauge that electrically senses contact between the substrate and the body of the lift pin 154A may be used.

The determination means 164 receives sensing signals from the displacement sensing means 161A, that is, the sensors, and determines the presence or the absence of a substrate. The determination means 164 may include control means for controlling the operation of an apparatus for manufacturing a flat panel display.

When it is determined that a substrate is present in the chamber 151, the control means may output a corresponding control signal such that the notification means 165, which may be electrically connected to the control means, may be actuated. Conversely, if it is determined that no substrate is present in the chamber 151, the control means may output a corresponding control signal such that a substrate to be processed may be introduced into the chamber 151. In this way, the control means controls the operation of the apparatus for manufacturing a flat panel display.

The notification means 165 may notify a worker of the presence of a substrate under the control of the control means. The notification means 165 may be, for example, a warning lamp 165w or a monitor for visual notification, or a speaker 165s or a buzzer for auditory notification. Other components may also be appropriate, and the visual notification means and auditory notification means may be used together.

Notification of the presence of a substrate may be implemented in a number of warning lamps 165w which corresponds to a number of sensors (that is, a number of lift pins 154A). Thus, when any one sensor outputs a sensing signal, the control means may turn on the corresponding warning lamp 165w in response to the sensing signal. If displacement does not occur in all the lift pins 154A (and one or more of the warning lamps 165W is not lit), even though a substrate is positioned the chamber 151, it can be determined that the substrate may be partially broken and/or erroneously loaded because the load of the substrate is not acting on one or more of the lift pins 154A. Consequently, it is possible to determine whether the substrate in the chamber 151 is in an appropriate state.

Figure 11A:
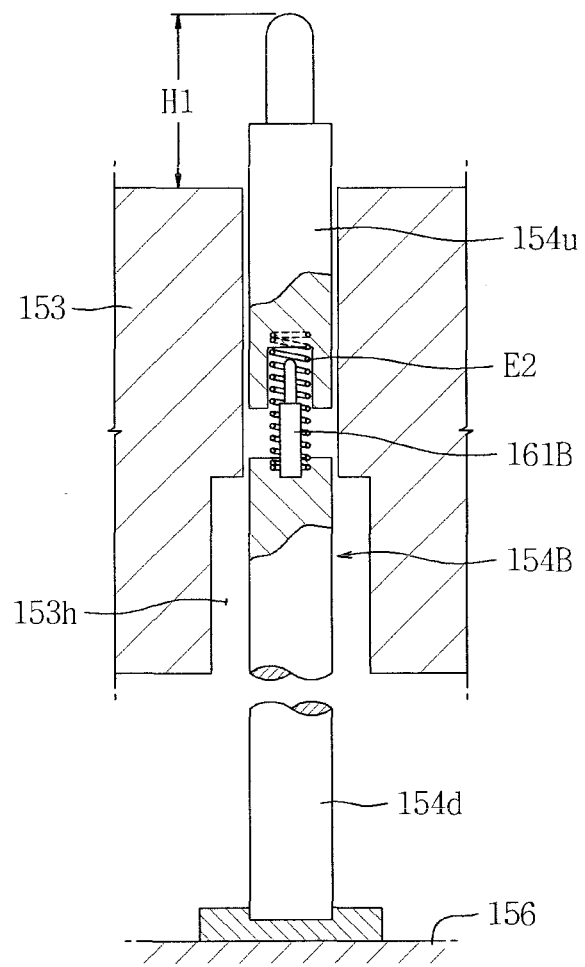
FIG. 11 is a cross-sectional view of a device for determining the presence or the absence of a substrate using lift pins, in accordance with a fifth embodiment as broadly described herein.
Figure 11B:
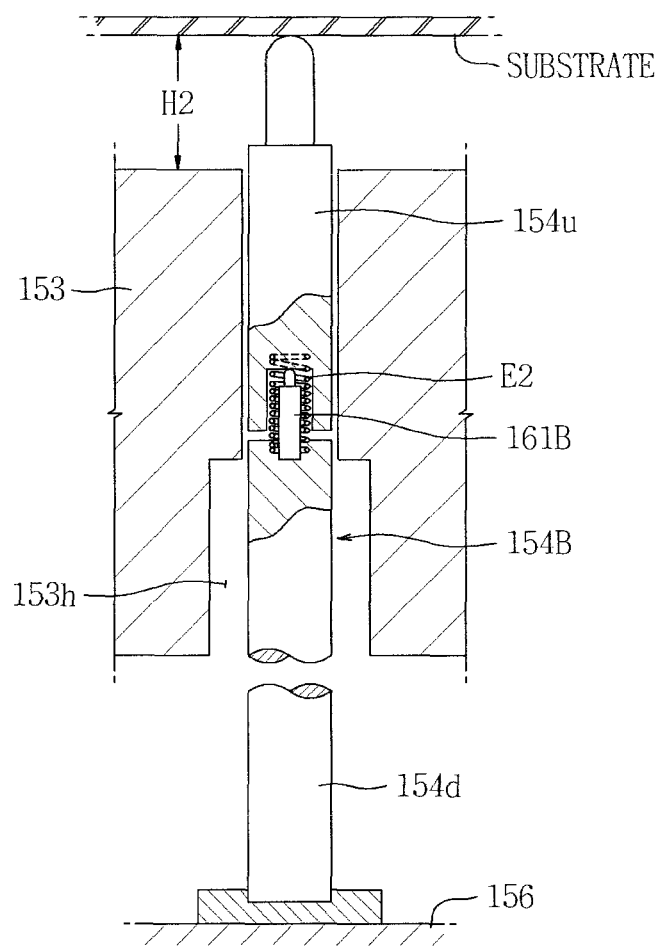

A device for determining the presence or the absence of a substrate using lift pins in accordance with a fifth embodiment as shown in FIG. 11 may include a plurality of lift pins 154B each having an upper pin 154u, a lower pin 154d positioned below the upper pin 154u and fixed to the pin plate 156 at the lower end thereof, and an elastic member E2 installed on the upper pin 154u or the lower pin 154d so as to be positioned between the lower pin 154d and the upper pin 154u and to elastically support the upper pin 154u.

The elastic member E2 may be a coil spring, rubber, sponge, or other suitable elastic component. In the same manner as the elastic member E1 shown in FIGS. 9-10B, the elastic member E2 may have sufficient strength to be compressed by the load of the substrate, but not to be compressed by the load of the upper pin 154u.

When comparing the projecting heights H2 of the lift pin 154B in a state in which a substrate is placed on the stage 153 to a projecting height H1 in which a substrate is not placed on the stage 153, in the case of the lower pin 154d, the projecting height is not changed, whereas, in the case of the upper pin 154u, the projecting height is changed and displacement occurs.

The displacement sensing means 161B may perform functions similar to those of the displacement sensing means 161A shown in FIGS. 9-10B. Each displacement sensing means 161B may be installed on the upper pin 154u or the lower pin 154d, with an appropriate end inserted into the coil spring elastic member E2 so as to be positioned between the upper pin 154u and the lower pin 154d.

In alternative embodiments, the lift pin 154B may be constructed in such a way that the point at which the lift pin 154B is divided into the upper pin 154u and the lower pin 154d is always positioned outside of the chamber 151. When so configured, when the lift pin 154B is in the raised state, by providing an actuation arm (not shown) on the lower pin 154d as described above, the displacement sensing means 161B may instead be installed between the actuation arm and the pin plate 156.

Figure 12A:
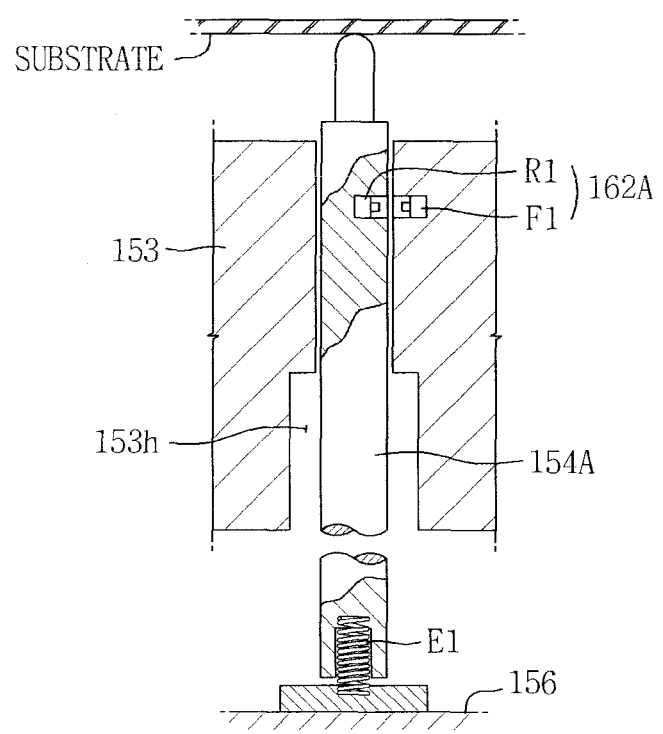
FIGS. 12A-12D are cross-sectional views of exemplary displacement sensing means which may be applied to the device for determining the presence or the absence of a substrate using lift pins shown in FIG. 9.

Various embodiments of displacement sensing means for use with the fourth embodiment as broadly described herein are shown in FIGS. 12A-12D. As shown in FIG. 12A, each displacement sensing means 162A may include a light emitting sensor F1 and a light receiving sensor R1. One of the light emitting sensor F1 or the light receiving sensor R1 may be installed on the body of the lift pin 154A, and the other may be installed on the wall of the pin hole 153h. The light receiving sensor R1 receives a signal from the light emitting sensor F1. To this end, the light emitting sensor F1 and the light receiving sensor R1 may be positioned opposite each other when the lift pin 154A is raised. If the light emitting sensor F1 and the light receiving sensor R1 are installed in this way, the light emitting sensor F1 and the light receiving sensor R1 can output and receive signals as the lift pin 154A is raised, irrespective of the presence of the substrate. For this reason, the output and receipt of a signal by the light emitting sensor F1 and the light receiving sensor R1, respectively, may be permitted only when the lift pin 154A is raised. Alternatively, the corresponding determination may be made only when the control means has received a signal from the displacement sensing means 162A for at least a predetermined time.

Figure 12B:
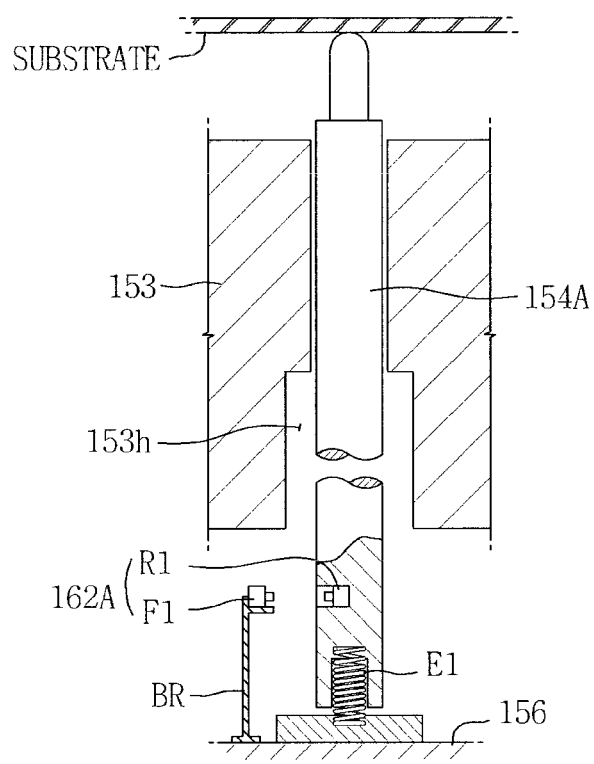

As shown in FIG. 12B, either one of the light emitting sensor F1 and the light receiving sensor R1 may instead be positioned at a predetermined height above the pin plate 156, rather than on the wall of the pin hole 153h. A bracket BR may be provided for holding the light emitting sensor F1 or the light receiving sensor R1 at the predetermined height from the pin plate 156.

Figure 12C:
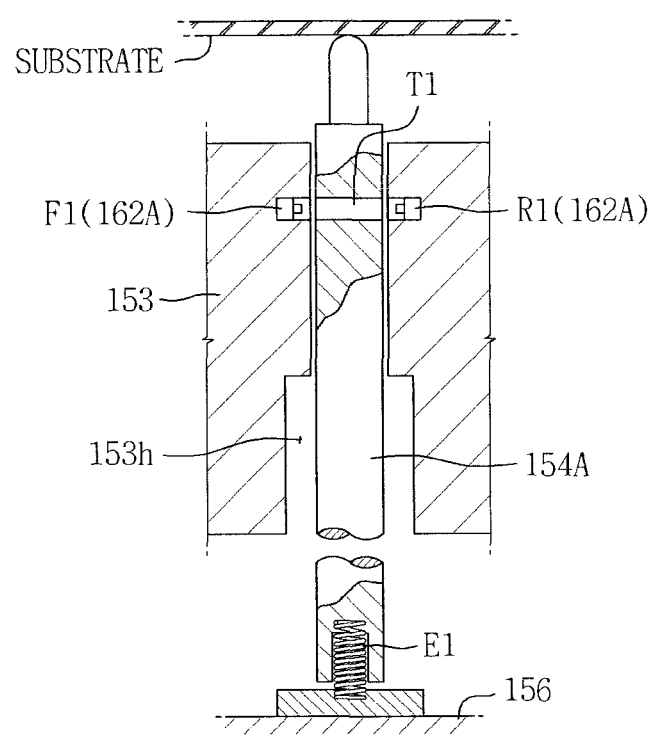

As shown in FIG. 12C, the light emitting sensor F1 and light receiving sensor R1 may instead be located in opposite side walls of the pin hole 153h, with the lift pin 154A interposed therebetween. A signal transmission hole T1 may extend through the lift pin 154A such that the light emitting sensor F1 and the light receiving sensor R1 may exchange a signal when aligned with the transmission hole T1. Thus, when the lift pin 154A is raised, the signal output by the light emitting sensor F1 may pass through the signal transmission hole T1 and be received by the light receiving sensor R1.

Figure 12D:
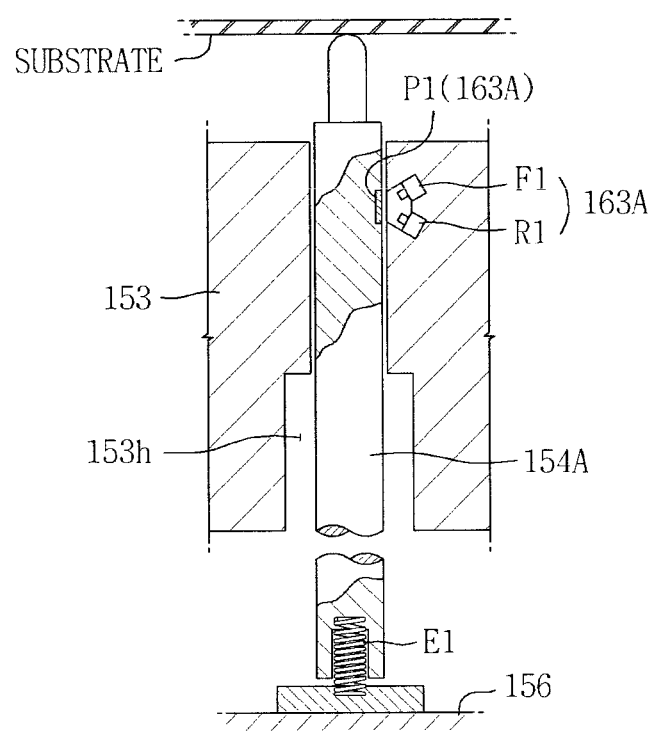

As shown in FIG. 12D, the displacement sensing means 163A may include a light emitting sensor F1, a light receiving sensor R1 and a reflection plate P1. The light emitting sensor F1 may output a signal to the reflection plate P1, and the light receiving sensor R1 may receive the signal reflected by the reflection plate P1. The reflection plate P1 may be installed on the lift pin 154A and both the light emitting sensor F1 and the light receiving sensor R1 may be installed on the wall of the pin hole 153h. The light emitting sensor F1 may be located such that a signal is transmitted toward the reflection plate P1 when displacement occurs in the lift pin 154A, and the light receiving sensor R1 may be located such that the signal transmitted by the light emitting sensor F1 and reflected by the reflection plate P1 may be received by the light receiving sensor R1 when displacement occurs in the lift pin 154A.

Various embodiments of displacement sensing means for use with the fifth embodiment as broadly described herein are shown in FIGS. 13A-13D. These embodiments may include a light emitting sensor F2, a light receiving sensor R2 and a reflection plate P2 similar to those discussed above with respect to FIGS. 12A-12D.

Figure 13A:
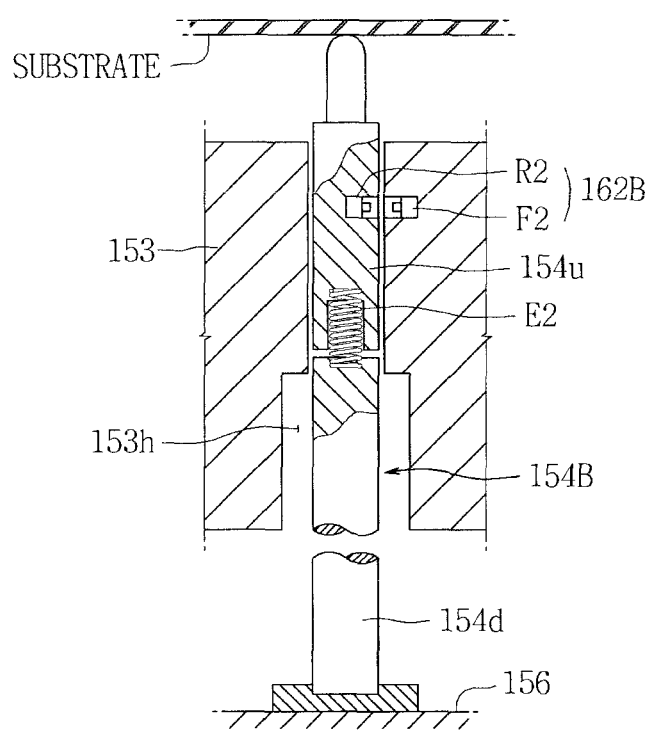
FIGS. 13A-13D are cross-sectional views of various displacement sensing means which may be applied to the device for determining the presence or the absence of a substrate using lift pins shown in FIG. 11.

As shown in FIG. 13A, each displacement sensing means 162B may include a light emitting sensor F2 and a light receiving sensor R2. One of the light emitting sensor F2 or the light receiving sensor R2 may be installed on the upper pin 154u of the lift pin 154B, and the other may be installed on the wall of the pin hole 153h such that the light emitting sensor F2 and the light receiving sensor R2 are positioned opposite each other when the lift pin 154B is raised.

Figure 13B:
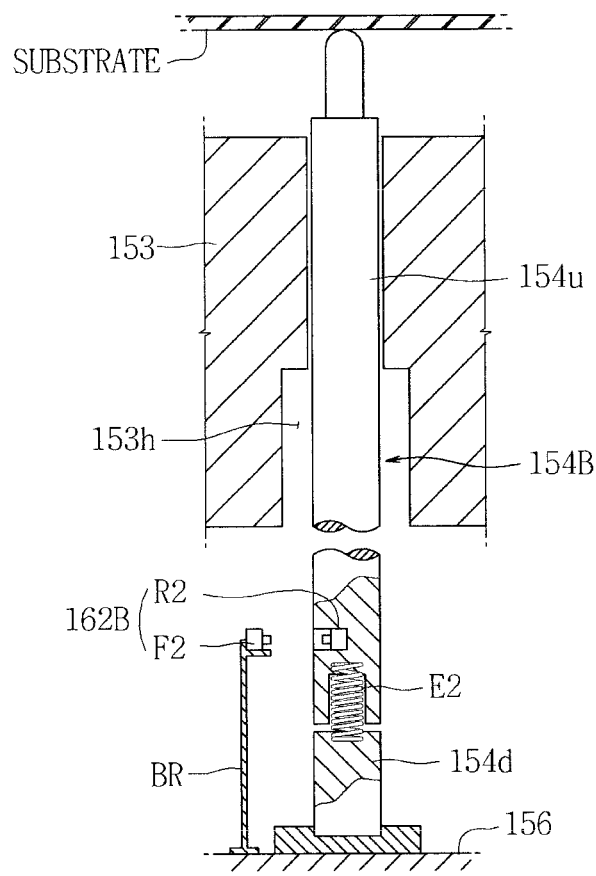
Figure 13C:
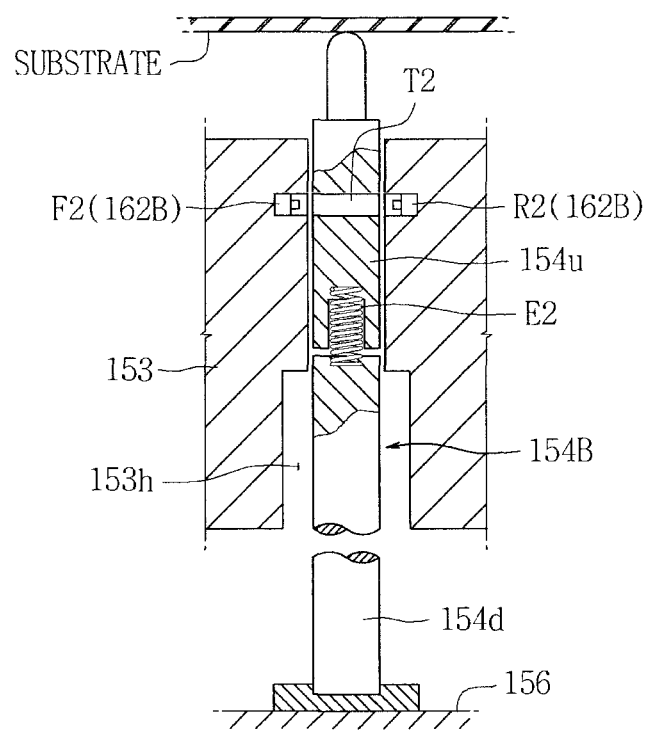

As shown in FIG. 13B, one of the above-described light emitting sensor F2 or the light receiving sensor R2 may instead be held by a bracket BR at a predetermined height from the pin plate 156, rather than on the wall of the pin hole 153h.

As shown in FIG. 12C, the above-described light emitting sensor F2 and light receiving sensor R2 may instead be located on opposite side walls of the pin hole 153h, with the lift pin 154B interposed therebetween. A signal transmission hole T2 may extend through the upper pin 154u such that the light emitting sensor F2 and the light receiving sensor R2 may exchange a signal when the lift pin 154B is raised and the signal transmission hole T1 is aligned therewith.

Figure 13D:
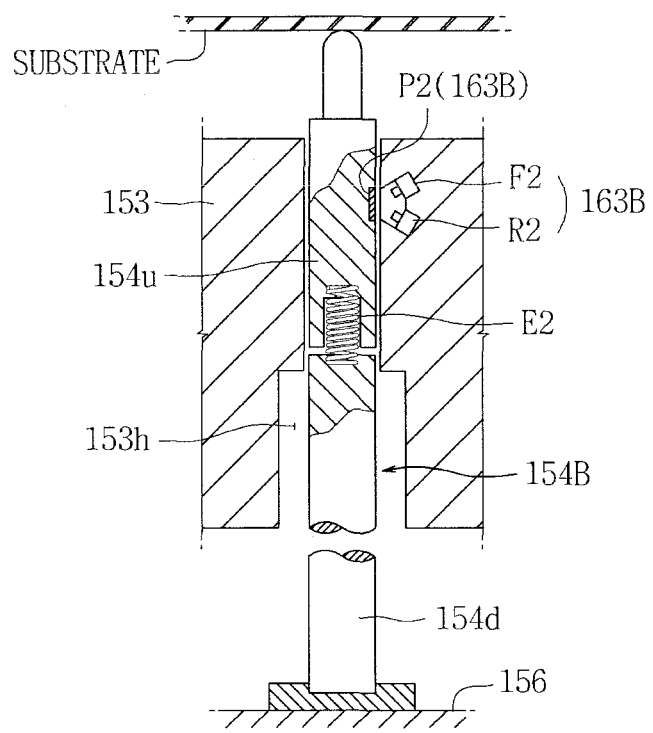

As shown in FIG. 13D, the displacement sensing means 163B may include a light emitting sensor F2, a light receiving sensor R2 and a reflection plate P2. The reflection plate P2 may be installed on the upper pin 154u, and both the light emitting sensor F2 and the light receiving sensor R2 may be installed on the wall of the pin hole 153h. The light emitting sensor F2 may be located such that a signal is transmitted toward the reflection plate P2 when displacement occurs in the lift pin 154B, and the light receiving sensor R2 may be located such that the signal reflected by the reflection plate P2 may be received by the light receiving sensor R2 when displacement occurs in the lift pin 154B.

Figure 14:
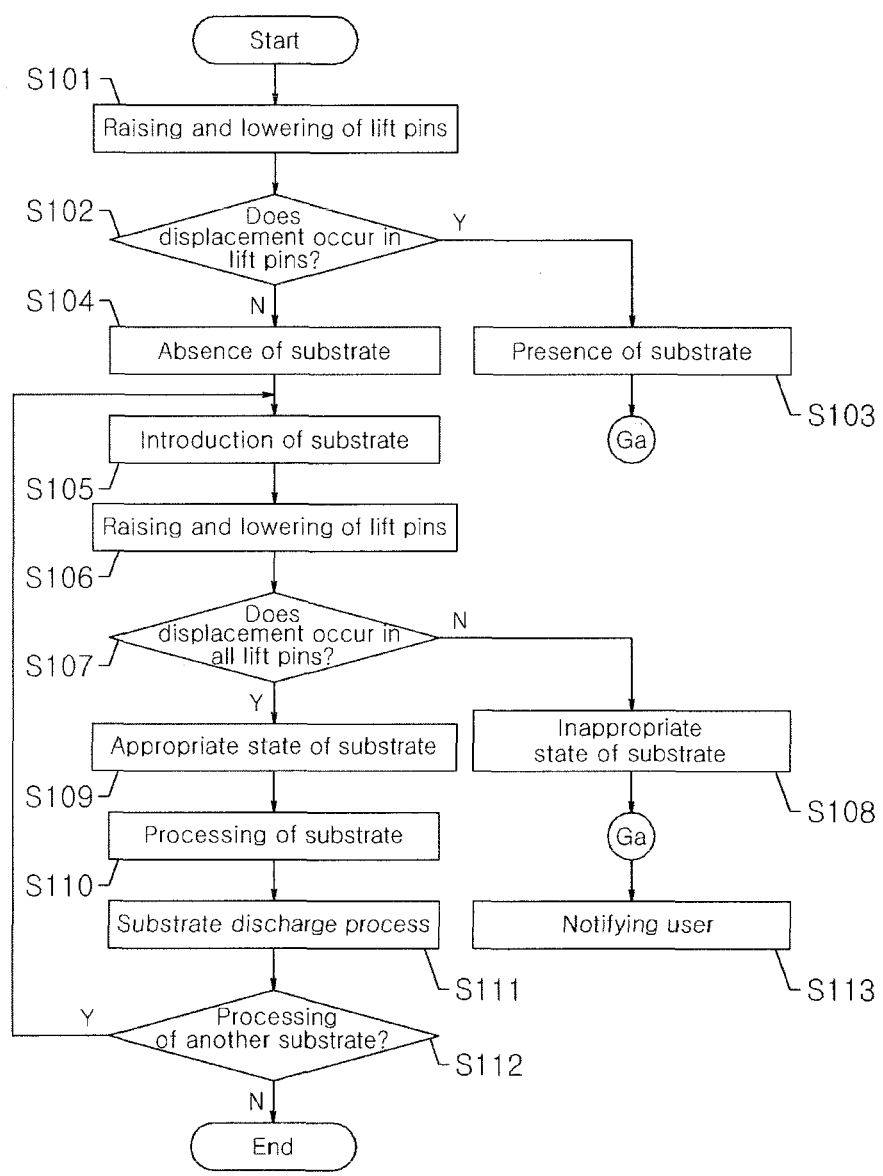
FIG. 14 is a flow chart of a method for introducing a substrate and inspecting a state of the introduced substrate by employing the device for determining the presence or the absence of a substrate using lift pins shown in FIG. 9 or FIG. 11.

A method for introducing a substrate and inspecting the state of the introduced substrate using the device for determining the presence or the absence of a substrate according to the fourth embodiment or the fifth embodiment as broadly described herein will be described with reference to FIG. 14.

Figure 8:
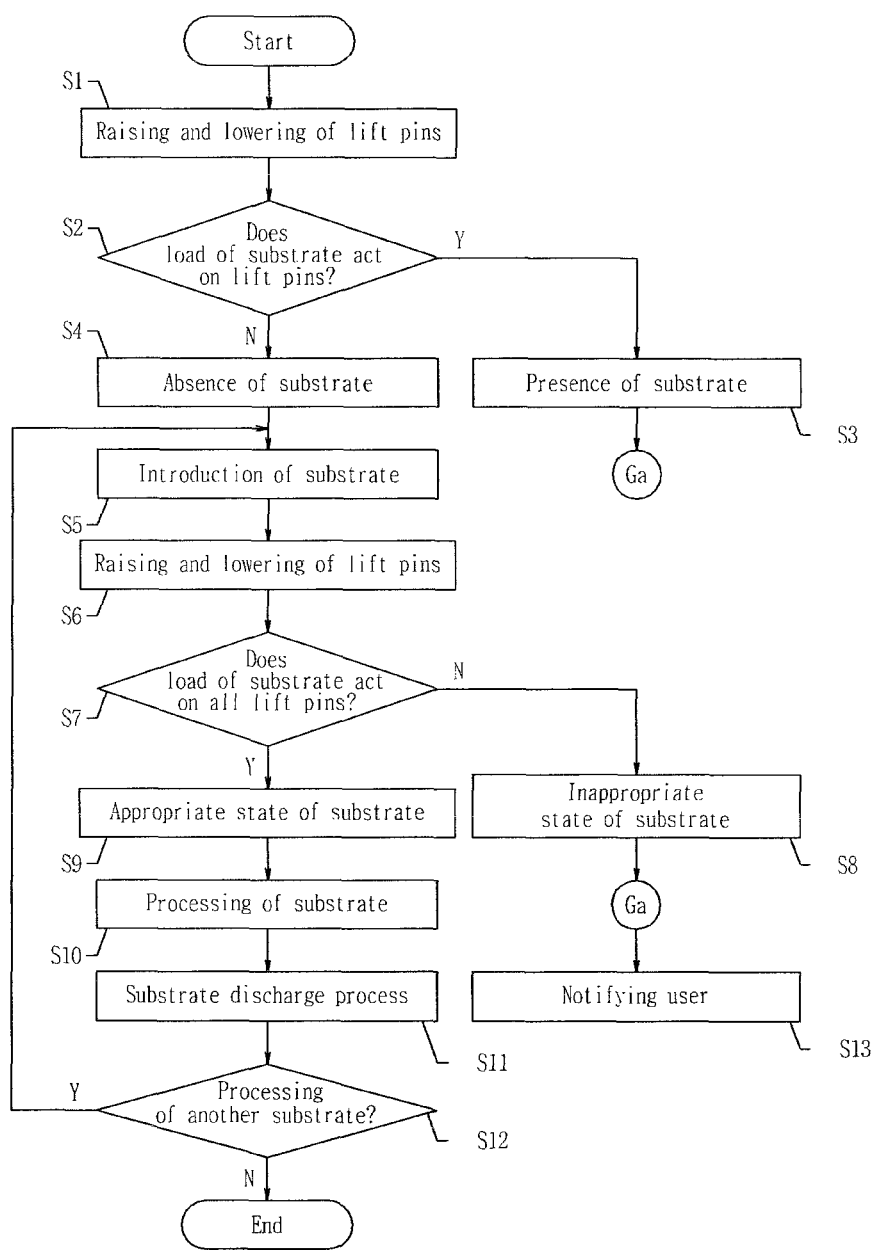
FIG. 8 is a flow chart of a method for introducing a substrate and inspecting a state of the introduced substrate by employing a device for determining the presence or the absence of a substrate using lift pins, in accordance with an embodiment as broadly described herein.

For reference, the device for determining the presence or the absence of a substrate according to the fourth embodiment (which includes several variations of the displacement sensing means) and the device for determining the presence or the absence of a substrate according to the fifth embodiment (which also includes several variations of the displacement sensing means) may be similarly used in the method for introducing a substrate and inspecting the state of the introduced substrate shown in FIG. 8. Simply for ease of discussion, this method will be described using the device for determining the presence or the absence of a substrate according to the fourth embodiment. However, it is well understood that this method may also be applied with the fifth embodiment.

During normal operation, the lift pins 154A may be lowered and inserted into the pin holes 153h such that the upper ends thereof do not project from the stage 153. To introduce into the chamber 151 a substrate which is in a standby state in a load lock chamber, and load the substrate onto the stage 153 for processing, the plurality of lift pins 154A may be simultaneously raised to receive the substrate, and then lowered to original positions thereof, by the driving force from the pin lifting mechanism 155 (S101).

In this procedure, the sensors of the displacement sensing means 161A may sense whether a substrate is placed on the lift pins 154A and the elastic members E1 are compressed by the load of the substrate to cause displacement of the lift pins 154A when the lift pins 154A are raised, and the control means may receive the sensing results from the sensors (S102). The control means may determine the presence of a substrate if a sensing signal from at least one sensor is inputted thereto (S103). Conversely, if no sensing signal is inputted from the sensors, the control means determines the absence of a substrate (S104).

When the presence of a substrate is determined (S103), the control means outputs a control signal and actuates the notification means 165 (S113). A worker can recognize the presence of the substrate based on the notification, and may take necessary actions. In this case, the control means may be further configured to prevent the introduction of a new substrate if an existing substrate is sensed in the chamber 151. Alternatively, or additionally, the process may proceed to determining whether or not displacement occurs in each of the lift pins 154A (S107) to determine a state of the detected substrate.

When the absence of a substrate is determined (S104), the transfer robot may be driven to introduce a substrate to be processed, and position the substrate above the stage 153 (S105). The lift pins 154A may be raised to receive thereon the newly introduced substrate from the transfer robot, and then lowered to their original positions (S106). After the lift pins 154A receive the substrate, the transfer robot may move out of the chamber 151.

The sensors sense whether displacement occurs in the lift pins 154A, and the control means receives the sensing results from the sensors (S107). If a sensing signal is not received from each of the sensors, the control means determines that the corresponding portion of the substrate is broken (see FIG. 2A) and/or that the substrate has been erroneously loaded (see FIG. 2B) (S108). Conversely, if sensing signals are received from all the sensors, the control means determines that the substrate is not broken and that the loading of the substrate has been appropriately implemented (S109).

If it is determined that the substrate is in an inappropriate state (S108), the control means outputs a signal to actuate the notification means 165 (S13), in order to notify the worker of this situation. Therefore, the worker can recognize the state of the substrate and can take appropriate corrective actions. The control means may be further configured to interrupt subsequent processing until corrective action has been implemented.

Conversely, if it is determined that the substrate is in an appropriate state (S109), the surface treatment of the substrate is implemented (S110). If the surface treatment is completed, the substrate, having completely undergone the surface treatment, is discharged through raising of the lift pins 154A, introduction of the transfer robot into the chamber 151, lowering of the lift pins 154A and movement of the transfer robot out of the chamber 151 (S111). The apparatus may then either process another substrate, or complete the processing operation (S112).

Figure 15:
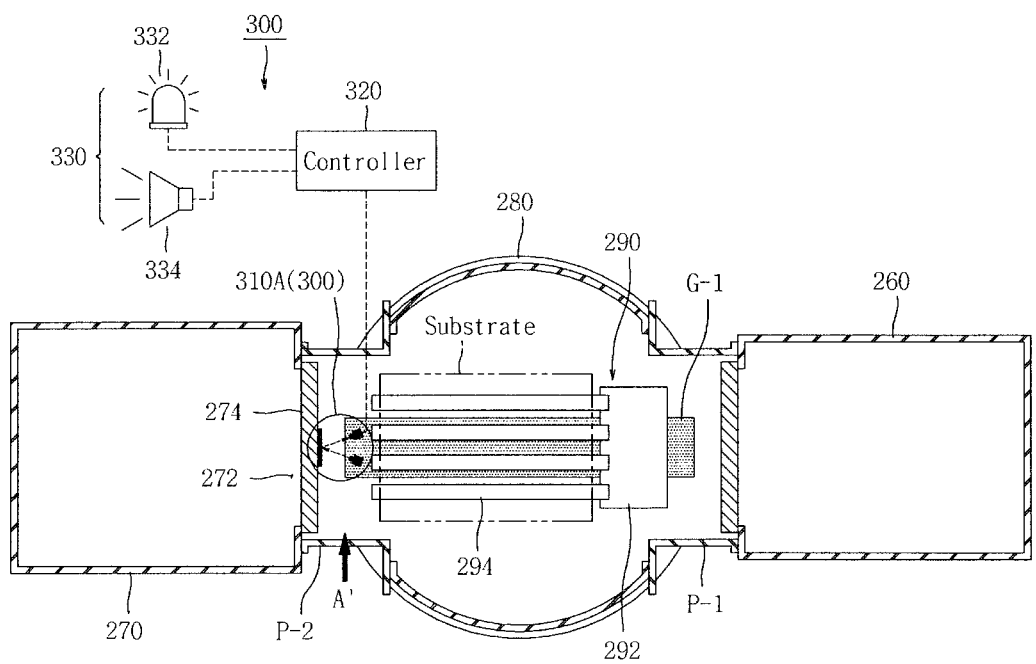
FIG. 15 is a cross-sectional view of an apparatus for manufacturing a flat panel display, to which a device for determining the opening or the closing of a gate valve, in accordance with a sixth embodiment as broadly described herein, may be applied.

FIG. 15 is a cross-sectional view of an apparatus for manufacturing a flat panel display to which a device for determining the opening or the closing of a gate valve, in accordance with a sixth embodiment as broadly described herein, may be applied.

The apparatus may include a load lock chamber 260 which receives an unprocessed substrate from the outside and stores it, or receives a processed substrate and discharges it to the outside. The apparatus may also include a process chamber 270 which receives the unprocessed substrate from the load lock chamber 260 and processes it, and which has defined in a sidewall thereof a gate slit 272 opened and closed by a gate valve 274 serving as a gateway for a substrate. The apparatus may also include a transfer chamber 280 provided between the process chamber 270 and the load lock chamber 260, a transfer robot 290 provided in the transfer chamber 280 to reciprocate between the load lock chamber 260 and the process chamber 270 and transfer a substrate from the load lock chamber 260 to the process chamber 270 or from the process chamber 270 to the load lock chamber 260, a guide G-1 which guides the precise movement of the transfer robot 290, and a device 300 which determines the opening or the closing of the gate valve 274.

The load lock chamber 260 and the transfer chamber 280 may be connected by a transfer passage P-1, and the process chamber 270 and the transfer chamber 280 may be connected by a transfer passage P-2. A gateway for a substrate may be defined between the load lock chamber 260 and the transfer chamber 280 to serve in a similar manner as the gate slit 272, and a door (a gate valve) may be installed in the gateway to open and close the gateway.

The process chamber 270 may be configured to implement surface treatment of a substrate under a vacuum condition. The treatment may be implemented using plasma, thermal energy, and the like. Also, the gate valve 274 of the process chamber 270 may open and close the gate slit 272 outside the process chamber 270. The gate valve 274 may be a rotary type, in which one end thereof is hingedly coupled to the process chamber 270 to open and close the gate slit 272 as it pivots, or as a vertical movement type, in which the gate valve 274 moves linearly to open and close the gate slit 272. The gate valve 274 may be actuated by driving means (not shown).

The transfer robot 290 may include a robot body 292 which moves on the guide G-1, hands 294 connected to the robot body 292 and on which substrates to be transferred are respectively placed, and driving means (not shown) which provides driving force for moving the robot body 292.

The device 300 which determines the opening or the closing of the gate valve 274 may include gate valve sensing means 310A, determination means 320 and notification means 330. The gate valve sensing means 310A may sense whether the gate valve 274 is opened to open the gate slit 272 or is closed to close the gate slit 272. The gate valve sensing means 310A may be configured such that, when the closing of the gate valve 274 is sensed, the corresponding sensing result (a sensing signal) may be substantially immediately output from the gate valve sensing means 310A to the determination means 320, which electrically connected to the gate valve sensing means 310A.

Figure 16:
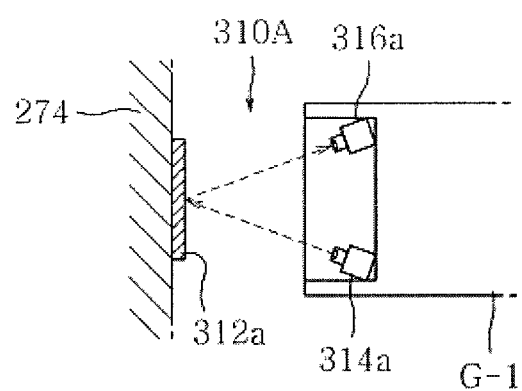
FIG. 16 is an enlarged view of the gate valve sensing means shown in FIG. 15.
Figure 17:
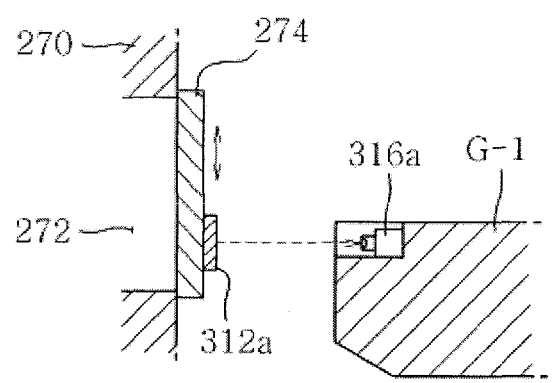
FIG. 17 is a cross-sectional view of the gate valve sensing means shown in FIG. 15, taken in the direction indicated by the arrow A'.

As shown in FIGS. 16 and 17, the gate valve sensing means 310A may include a reflection plate 312a and an optical sensor module. The reflection plate 312a may be installed on the outer side (the surface facing the transfer chamber 280) of the gate valve 274. The optical sensor module may output a signal (light) to the reflection plate 312a and receive the signal reflected by the reflection plate 312a. The optical sensor module may include a light emitting sensor 314a and a light receiving sensor 316a.

The light emitting sensor 314a outputs a signal to the reflection plate 312a, and the light receiving sensor 316a receives the signal output by the light emitting sensor 314a and reflected by the reflection plate 312a. In order to make this possible, the optical sensor module may be placed at a position opposite the reflection plate 312a. Thus, the optical sensor module may be installed on the guide G-1, which guides the movement of the transfer robot 290 as described above. The light emitting sensor 314a and the light receiving sensor 316a may be installed so as not to interfere with the movement of the transfer robot 290 on the guide G-1. The installation positions of the reflection plate 312a and the optical sensor module may be reversed, with the reflection plate 312a installed on the guide G-1, and the optical sensor module installed on the gate valve 274.

As described above, the determination means 320 receives the sensing result from the gate valve sensing means 310A and determines whether the gate valve 274 is in an opened state or a closed state. The determination means 320 may include control means for controlling the operation of the apparatus for manufacturing a flat panel display.

When the control means receives a sensing result from the gate valve sensing means 310A indicating that the gate valve 274 is closed, the control means outputs a corresponding control signal such that the notification means 330, which may be electrically connected to the control means, may be actuated. When the control means determines that the gate valve 274 is open, the control means outputs a corresponding control signal such that a substrate that is being stored in the load lock chamber 260 and has not been processed may be transferred by the transfer robot 290 and introduced into the process chamber 270.

The notification means 330 may notify a worker whether the gate valve 274 is opened or closed under control of the control means. The notification means 330 may include a warning lamp 332 (which, for example, may be turned on to indicate the opening of the gate valve 274 and turned off to indicate the closing of the gate valve 274, or vice-versa). Alternately, a monitor for visual notification may be adopted, or a speaker 334 (which, for example, may generate no sound to indicate the opening of the gate valve 274 and generate sound to indicate the closing of the gate valve 274, or vice-versa) or a buzzer for auditory notification may be adopted. Additionally, visual notification means and auditory notification means may be adopted together.

Figure 18:
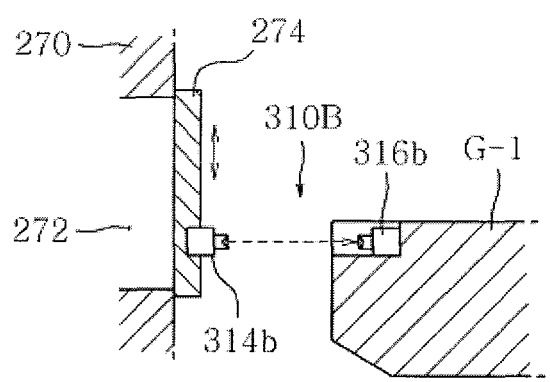
FIG. 18 is a partial cross-sectional view of a device for determining the opening or the closing of a gate valve, in accordance with a seventh embodiment as broadly described herein.

A device for determining the opening or the closing of a gate valve, in accordance with a seventh embodiment, as shown in FIG. 18, may include gate valve sensing means 310B including a light emitting sensor 314b installed outside the gate valve 274, and a light receiving sensor 316b installed on the guide G-1. The light emitting sensor 314b may output a signal (light), and the light receiving sensor 316b may receive the signal output by the light emitting sensor 314b. Thus, the light emitting sensor 314b and the light receiving sensor 316b may be installed opposite one another, and their installation positions may be reversed.

Figure 19:
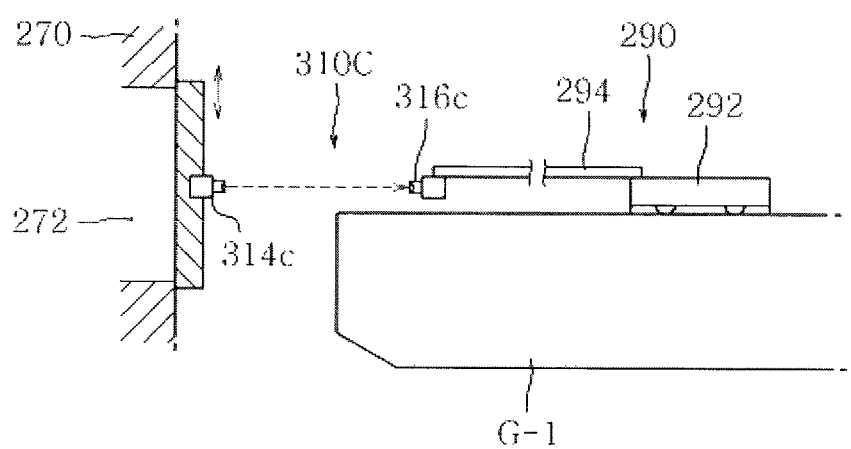
FIG. 19 is a partial sectional view of a device for determining the opening or the closing of a gate valve, in accordance with an eighth embodiment as broadly described herein.

A device for determining the opening or the closing of a gate valve, in accordance with an eighth embodiment, as shown in FIG. 19, may include gate valve sensing means 310C including a light emitting sensor 314c installed on the outer side of the gate valve 274, and a light receiving sensor 316c provided on the transfer robot 290 and positioned opposite the light emitting sensor 314c. The light receiving sensor 316c may be installed on a distal end of the hand 294 of the transfer robot 290. The installation positions of the light emitting sensor 314c and the light receiving sensor 316c may be reversed, and light receiving sensor 316c need not be necessarily installed on the hand 294. It is sufficient for the light receiving sensor 316c to be installed on the transfer robot 290 so as to be capable of exchanging a signal with the light emitting sensor 314c and so as not to obstruct the operation of the transfer robot 290.

Although the device for determining the opening or the closing of a gate valve in accordance with the eighth embodiment has been explained as a variation of the construction of the seventh embodiment, the eighth embodiment may also be explained by varying the construction of the sixth embodiment. In this case, one of the reflection plate or the optical sensor module may be installed on the gate valve 274, and the other may be installed on the transfer robot 290.

Figure 20:
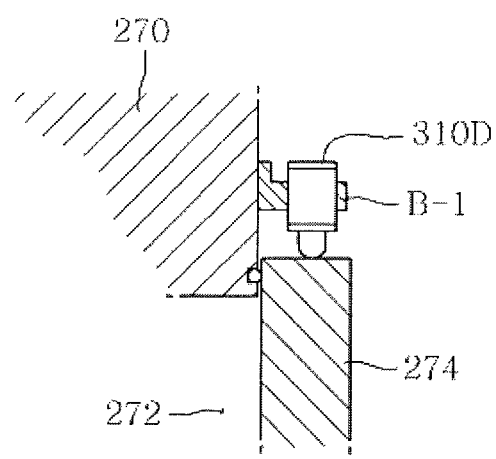
FIG. 20 is a partial cross-sectional view of a device for determining the opening or the closing of a gate valve, in accordance with a ninth embodiment as broadly described herein.

A device for determining the opening or the closing of a gate valve, in accordance with a ninth embodiment, as shown in FIG. 20, may include gate valve sensing means 310D including a sensor held by a bracket B-1. This sensor may be installed on a line of action along which the force for closing the gate valve 274 is applied, so as to be actuated by the force. When the force is applied to the sensor, the sensor is actuated thereby, and outputs a sensing signal to the determination means 320 (see FIG. 15). The sensor may be installed over the gate valve 274 so as to come into contact with the upper surface of the gate valve 274 when the gate valve 274 is closed. The sensor need not be necessarily installed in this way, and it is sufficient for the sensor to be installed so as to be positioned on the line of action and thereby be subjected to the action force. For example, a push switch may be configured such that an electrical connection is mechanically created when the push switch is pushed by the gate valve 274. Alternatively, an electric contact sensor or an electric strain gauge for electrically sensing contact with the gate valve 274 may be employed.

Figure 21:
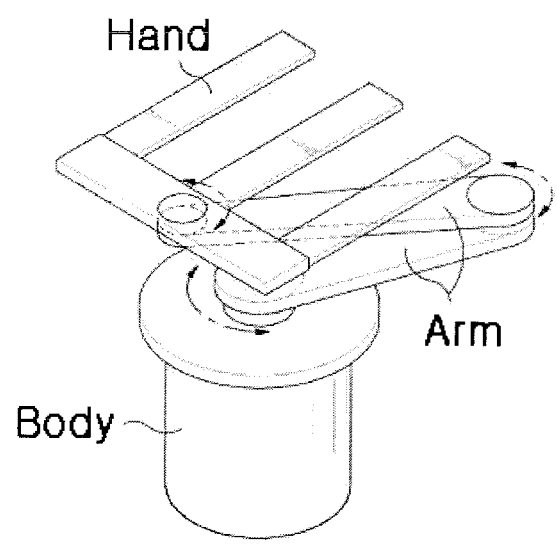
FIG. 21 is a perspective view of an exemplary transfer robot.

FIG. 21 is a perspective view of an exemplary transfer robot including an arm provided between a robot body and robot hands. The arm may be constructed to fold and unfold, as shown in shadow in FIG. 21. In the devices for determining the opening or the closing of a gate valve according to the sixth through eighth embodiments, the component elements of the gate valve sensing means may be installed on the robot body, the hand or the arm of the transfer robot.

A method for introducing a substrate into a process chamber using the device for determining the opening or the closing of a gate valve according to embodiments as broadly described herein will be discussed. For reference, the device according to the sixth embodiment and the devices according to the other embodiments may be similarly used in the method for introducing a substrate. Hereafter, the method will be described using the device according to the sixth embodiment.

During normal operation, the gate valve 274 is kept closed, and the gate slit 272 is maintained in the closed state. The device 300 for determining the opening or the closing of a gate valve determines whether the gate valve 274 is opened or closed, and indicates this to a worker.

If the gate valve 274 is closed, the signal output by the light emitting sensor 314*a* of the gate valve sensing means 310A is directed toward the reflection plate 312*a*, which is installed on the gate valve 274. This signal is reflected by the reflection plate 312*a* and is received by the light receiving sensor 316*a*. At this time, the gate valve sensing means 310A outputs the corresponding sensing result to the determination means 320. The determination means 320 receives the sensing result, determines that the gate valve 274 is closed, and outputs a corresponding control signal to the notification means 330. The notification means 330 notifies a worker that the gate valve 274 is closed.

When it is necessary to introduce a substrate to be processed into the process chamber 270 and process the substrate, the gate valve 274 may be opened by, for example, being lowered by the driving force of the driving means. If the gate valve 274 cannot be opened due to, for example, breakdown or misoperation, the device 300 for determining the opening or the closing of a gate valve notifies the worker that the gate valve 274 is still closed. The worker can then precisely recognize the opened or the closed state of the gate valve 274 and can take necessary corrective action. In this case, the determination means 320 may be further configured to prevent the introduction of a substrate until corrective action has been implemented.

As the gate valve 274 is opened, a position of the reflection plate 312*a* changes with respect to the opened gate valve 274, the reflection plate 312*a* cannot reflect the signal output the light emitting sensor 314*a*, and the light receiving sensor 316*a* cannot receive the signal from the light emitting sensor 314*a*. As a consequence, the device 300 for determining the opening or the closing of a gate valve notifies the worker that the gate valve 274 is open.

When it is determined by the device 300 that the gate valve 274 is open, the transfer robot 290 conducts an introducing process, as described below.

The transfer robot 290 is moved along the guide G-1 to the load lock chamber 260. In the load lock chamber 260, a substrate to be processed is loaded on the hand 294, and then the transfer robot 290 is moved along the guide G-1 to the process chamber 270. The transfer robot 290 enters the process chamber 270 through the gate slit 272, the substrate loaded on the hand 294 is unloaded in the process chamber 270, and the transfer robot 290 is returned to its original position in the transfer chamber 280. When the transfer robot 290 moves out of the process chamber 270, the gate valve 274 is closed by, for example, being raised by the driving force of driving means, and processing of the substrate is conducted in the process chamber 270.

A device is provided that determines the presence or the absence of a substrate using lift pins, in which whether the load of a substrate acts on lift pins is sensed, and the presence or the absence of a substrate is determined depending upon the sensing result, so that a worker can quickly and conveniently confirm the presence of a substrate.

A device is provided that determines the presence or the absence of a substrate using lift pins, in which the projecting height of the lift pins is changed depending upon the presence or the absence of a substrate, whether displacement occurs in the lift pins is sensed, and the presence or the absence of a substrate is determined depending upon the sensing result, so that a worker can quickly and conveniently confirm the presence of a substrate.

A device that determines the presence or absence of a substrate as embodied and broadly described herein may include a plurality of lift pins installed to be raised and lowered through pin holes defined through a stage on which a substrate is placed, such that the lift pins are raised when the substrate is introduced into a chamber; substrate sensing means for sensing whether the raised lift pins carry the substrate; and determination means for receiving a sensing result from the substrate sensing means and determining the presence or absence of the substrate.

The substrate sensing means may sense whether the load of the substrate acts on the lift pins.

The substrate sensing means may include a sensor installed on at least one of lines of action, along which the load of the substrate acts on the lift pins, to be actuated by the load of the substrate. Alternatively, the substrate sensing means may include sensors installed along respective lines of action, along which the load of the substrate acts on the lift pins, to be actuated by the load of the substrate.

The sensors may be installed on upper ends of the lift pins to be brought into contact with the substrate, or may be installed between the lift pins and a lift pin support structure. Alternatively, each lift pin may be divided into an upper pin and a lower pin, and each sensor can be installed between the upper pin and the lower pin.

The respective lift pins may have a structure in which the projecting heights thereof change depending upon whether the lift pins carry the substrate, and the substrate sensing means may include displacement sensing means which senses whether the projecting heights of the respective lift pins are changed.

The displacement sensing means may sense the displacement of at least one of the lift pins, or may respectively sense the displacement of all the lift pins.

An elastic member may be installed between each lift pin and the lift pin support structure. The displacement sensing means may include a sensor installed along each line of action, along which the load of the substrate compresses the elastic member to decrease the distance between the lift pin and the lift pin support structure, to be actuated by the load of the substrate.

In certain embodiments, the displacement sensing means may also include a light emitting sensor, and a light receiving sensor for receiving a signal from the light emitting sensor. One sensor of the light emitting sensor and the light receiving sensor may be installed on the lift pin, and the other sensor may be located to be opposite the one sensor when displacement occurs in the lift pin.

In alternative embodiments, the displacement sensing means may include a light emitting sensor, and a light receiving sensor for receiving a signal from the light emitting sensor. The light emitting sensor and the light receiving sensor may be located opposite each other, with the lift pin interposed therebetween. A signal transmission hole may be defined through the lift pin such that the light receiving sensor may receive the signal from the light emitting sensor when displacement occurs in the lift pin.

In alternative embodiments, the displacement sensing means may include a reflection plate, a light emitting sensor for outputting a signal to the reflection plate, and a light receiving sensor for receiving the signal outputted from the light emitting sensor and reflected by the reflection plate. The reflection plate may be installed on the lift pin. The light emitting sensor and the light receiving sensor may be installed to output the signal to the reflection plate when displacement occurs in the lift pin, and then receive the reflected signal.

Each lift pin may be divided into an upper pin and a lower pin, and an elastic member may be installed between the upper pin and the lower pin.

The displacement sensing means may include a sensor installed along each line of action, along which the load of the substrate compresses the elastic member to decrease the distance between the upper pin and the lower pin, to be actuated by the load of the substrate.

In alternative embodiments, the displacement sensing means may also include a light emitting sensor and a light receiving sensor for receiving a signal from the light emitting sensor. One sensor of the light emitting sensor and the light receiving sensor may be installed on the upper pin of the lift pin, and the other sensor may be located to be opposite the one sensor when displacement occurs in the lift pin.

In alternative embodiments, the displacement sensing means may include a light emitting sensor, and a light receiving sensor for receiving a signal from the light emitting sensor. The light emitting sensor and the light receiving sensor may be located opposite each other, with the upper pin of the lift pin interposed therebetween, and a signal transmission hole may be defined through the upper pin of the lift pin such that the light receiving sensor may receive the signal from the light emitting sensor when displacement occurs in the lift pin.

In alternative embodiments, the displacement sensing means may include a reflection plate, a light emitting sensor for outputting a signal to the reflection plate, and a light receiving sensor for receiving the signal outputted from the light emitting sensor and reflected by the reflection plate. The reflection plate may be installed on the upper pin of the lift pin. The light emitting sensor and the light receiving sensor may be installed to output the signal to the reflection plate when displacement occurs in the lift pin and then receive the reflected signal.

The determination means may include control means, and the device can further comprise notification means for making known the presence or the absence of the substrate under the control of the control means.

In a device for determining the presence or the absence of a substrate according to embodiments as broadly described herein, whether the load of a substrate acts on the lift pins is sensed by the substrate sensing means and the determination means, and the presence or the absence of a substrate is determined depending upon the sensing result, whereby advantages are provided in that the presence or the absence of a substrate may be quickly and conveniently determined.

A method is provided for introducing a substrate into a chamber, wherein a device for determining the presence or the absence of a substrate, which senses a load and a displacement, may be used, and the introduction of a substrate into the chamber may be permitted only when another substrate is not present in the chamber, so that a substrate may be prevented from being introduced into the chamber while another substrate is present in the chamber and another substrate in the chamber may be prevented from being broken due to interference with a transfer robot.

A method for introducing a substrate into a chamber as embodied and broadly described herein may include determining whether a substrate is present or absent on a stage, using the device for determining the presence or absence of a substrate; and transferring a substrate to be processed onto the stage when it is determined that no substrate is present on the stage.

The method may also include making known the presence of a substrate when it is determined that the substrate is present on the stage.

In a method for introducing a substrate into a chamber, which uses the device for determining the presence or the absence of a substrate as embodied and broadly described herein, since a substrate may be introduced into the chamber only when it is determined by the determination means that no substrate is present in the chamber, it may be possible to prevent a substrate from being introduced while another substrate is present in the chamber. As a consequence, it may be possible to prevent another substrate in the chamber from being broken due to interference with a transfer robot.

A method for inspecting a substrate is provided, wherein a device for determining the presence or the absence of a substrate, which senses a load, is used, whether the load of a substrate acts on all lift pins is sensed, and, if there is at least one lift pin on which the load of the substrate does not act, it is determined that a portion of the substrate is broken or the substrate has been erroneously loaded, whereby the state of the introduced substrate can be easily detected.

A method for inspecting a substrate using a load sensing type device for determining the presence or absence of a substrate as embodied and broadly described herein may include sensing whether a load of a substrate acts on all lift pins when the substrate is introduced into a chamber; and determining the broken state of the substrate or the erroneously loaded state of the substrate depending upon the result of sensing whether the load of the introduced substrate acts on all the lift pins.

The method may also include making known the broken state of the substrate or the erroneously loaded state of the substrate when it is determined that the substrate is broken or has been erroneously loaded.

In a method for inspecting a substrate according to embodiments as broadly described herein, when sensing whether the load of a substrate acts on the lift pins, all the lift pins may be respectively sensed, and if at least one lift pin does not input a sensing result, it may be determined that a portion of the substrate is broken or the substrate has been erroneously loaded and therefore there is at least one lift pin on which the load of the substrate does not act, whereby the (appropriate or inappropriate) state of the introduced substrate may be easily detected.

A method is provided for inspecting a substrate, wherein a device for determining the presence or the absence of a substrate as embodied and broadly described herein, which senses displacement, may be used, whether displacement occurs in all lift pins may be sensed, and, if there is at least one lift pin in which displacement does not occur, it may be determined that a portion of the substrate is broken or the substrate has been erroneously loaded, whereby the state of the introduced substrate may be easily detected.

A method is provided for inspecting a substrate using a displacement sensing type device for determining the presence or absence of a substrate as embodied and broadly described herein may include sensing whether a substrate displaces all lift pins when the substrate is introduced into a chamber; and determining a broken state of the substrate or an erroneously loaded state of the substrate depending upon the result of sensing whether displacement occurs in all the lift pins due to the introduced substrate.

The method may also include making known the broken state of the substrate or the erroneously loaded state of the substrate when it is determined that the substrate is broken or has been erroneously loaded.

In a method for inspecting a substrate according to embodiments as broadly described herein, when sensing whether displacement occurs in the lift pins, all the lift pins may be respectively sensed, and if at least one lift pin does not input a sensing result, it may be determined that a portion of the substrate is broken or that the substrate has been erroneously loaded, and therefore there is at least one lift pin on which the load of the substrate does not act, whereby the (appropriate or inappropriate) state of the introduced substrate may be easily detected.

A device is provided for determining the opening or the closing of a gate valve, in which the state of a gate valve is sensed, and whether the gate valve may be opened or closed may be determined depending upon the sensing result, whereby advantages are provided in that a worker may quickly and conveniently confirm the opening or the closing of the gate valve.

A device for determining the opening or closing of a gate valve as embodied and broadly described herein may include gate valve sensing means for sensing the opened state or a closed state of a gate valve for opening and closing a gate slit of a chamber; and determination means for receiving a sensing result from the gate valve sensing means and determining the opening or closing of the gate valve.

The gate valve sensing means may include a light emitting sensor, and a light receiving sensor for receiving a signal outputted from the light emitting sensor. One sensor of the light emitting sensor and the light receiving sensor may be installed on the gate valve, and the other sensor may be located to be opposite the one sensor.

The gate valve sensing means may include a reflection plate, and an optical sensor module for outputting a signal to the reflection plate and receiving the signal reflected by the reflection plate. One of the reflection plate and the optical sensor module may be installed on the gate valve, and the other may be located to be opposite the first one.

In certain embodiments, one of the gate valve sensing means, which is installed on the gate valve, may be placed on the outer side of the gate valve, and the other of the gate valve sensing means may be installed on a transfer robot for transferring the substrate to introduce and discharge the substrate into and from the chamber.

In alternative embodiments, one of the gate valve sensing means, which is installed on the gate valve, may be placed on the outer side of the gate valve, and the other of the gate valve sensing means may be installed on a guide which guides the movement of a transfer robot for introducing and discharging the substrate into and from the chamber.

The gate valve sensing means may include a sensor installed along a line of action, along which force for closing the gate valve acts on the gate valve, to be actuated by the force for closing the gate valve.

The determination means may include control means; and the device may also include notification means for making known the opening or the closing of the gate valve under the control of the control means.

In a device for determining the opening or the closing of a gate valve according to embodiments as broadly described herein, advantages are provided in that, since the opening or the closing of the gate valve may be sensed using the gate valve sensing means, and whether the gate valve is opened or closed may be determined depending upon the sensing result and then made known, the opening or the closing of the gate valve may be quickly and conveniently confirmed, and the (opened or closed) state of the gate valve may be precisely recognized.

A method is provided for introducing a substrate into a chamber, wherein a device for determining the opening or the closing of a gate valve as embodied and broadly described herein is used, and a substrate may be introduced into the chamber only when the gate valve is opened, whereby it may be possible to prevent a substrate from being introduced while the gate valve is closed, so that the substrate and a transfer robot, on which the substrate is placed, may be kept from being damaged due to collision with the gate valve.

A method for introducing a substrate into a chamber as embodied and broadly described herein may include determining whether a gate valve is opened or closed, using the device for determining the opening or closing of a gate valve; and transferring a substrate to be processed into the chamber when it is determined that the gate valve is opened.

The method may also include making known the closing of the gate valve when it is determined that the gate valve is closed.

In a method for introducing a substrate into a chamber according to embodiments as broadly described herein, which uses the device for determining the opening or the closing of a gate valve, advantages are provided in that, since a substrate may be introduced only when it is determined by the determination means that the gate valve is opened, it may be possible to prevent a substrate to be processed from being introduced into the chamber while the gate valve is closed, so that the substrate and a transfer robot, on which the substrate is placed, may be kept from colliding against the gate valve, thereby preventing the substrate, the transfer robot and the gate valve from being damaged.

Any reference in this specification to "one embodiment," "an embodiment," "example embodiment," "certain embodiment," "alternative embodiment," etc., means that a particular feature, structure, or characteristic described in connection with the embodiment is included in at least one embodiment as broadly described herein. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A device for use with a process chamber for processing substrates, the device comprising:
a gate valve sensor configured to sense a position of a gate valve that opens and closes an opening in the process chamber and to output a first signal;
a determination device configured to receive the first signal from the gate valve sensor, to determine whether the gate valve is in an opened or a closed position relative to the opening in the process chamber, and to output a second signal; and a notification device configured to receive the second signal from the determination device and to provide at least one of a visual or an audible indication of the position of the gate valve, wherein the gate valve sensor comprises a light emitting sensor and a light receiving sensor, wherein the light emitting sensor and the light receiving sensor are installed opposite each other, with one of the light emitting sensor or the light receiving sensor installed on the gate valve, and the other installed on a guide positioned at least partially in the process chamber, wherein the guide is configured to guide movement of a transfer robot into and out of the process chamber.

2. The device of claim 1, wherein the gate valve sensor further comprises installed on the gate valve and the light emitting sensor wherein the light receiving sensor is installed opposite the reflection plate such that light emitted by the light emitting sensor is received and reflected by the reflection plate, and the signal reflected by the reflection plate is received by the light receiving sensor.

3. The device of claim 1, wherein the gate valve sensor comprises a push switch, an electric contact switch, or an electronic strain gauge coupled to the process chamber proximate the gate valve, wherein the gate valve sensor is actuated in response to contact with the gate valve.

4. A method for introducing a substrate into a process chamber, the method comprising:

determining a position of a gate valve that opens and closes an opening in the process chamber using a gate valve sensor, the gate valve sensor comprising a light emitting sensor and a light receiving sensor installed opposite each other, with one of the light emitting sensor or the light receiving sensor installed on the gate valve, and the other installed on a guide positioned at least partially in the process chamber to guide movement of a transfer robot into and out of the process chamber; and transferring a substrate into the process chamber when it is determined that the gate valve is open.

5. The method of claim 4, wherein determining a position of the gate valve comprises sensing movement of the gate valve and determining a position of the gate valve based on the detected movement.

6. The method of claim 4, further comprising providing notification of the position of the gate valve in the form of at least one of a visual or an audible indicator.

* * * * *